United States Patent
Williams et al.

[11] Patent Number: 6,046,470
[45] Date of Patent: *Apr. 4, 2000

[54] TRENCH-GATED MOSFET WITH INTEGRAL TEMPERATURE DETECTION DIODE

[75] Inventors: Richard K. Williams, Cupertino; Wayne Grabowski, Los Altos, both of Calif.

[73] Assignee: Siliconix Incorporated, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/946,613

[22] Filed: Oct. 7, 1997

Related U.S. Application Data

[63] Continuation of application No. 08/537,959, Oct. 2, 1995, abandoned.

[51] Int. Cl.[7] .......................... H01L 29/76; H01L 29/94; H01L 31/062; H01L 31/113
[52] U.S. Cl. .......................................... 257/328; 257/470
[58] Field of Search ................................. 257/328, 470

[56] References Cited

U.S. PATENT DOCUMENTS

| | | | |
|---|---|---|---|
| 4,896,196 | 1/1990 | Blanchard et al. | 257/328 |
| 5,378,914 | 1/1995 | Ohzu et al. | 257/330 |

*Primary Examiner*—Stephen D. Meier
*Attorney, Agent, or Firm*—Skjerven, Morrill, MacPherson, Franklin & Friel LLP; David E. Steuber

[57] ABSTRACT

A vertical N-channel trenched-gate power MOSFET includes an integral temperature detection diode. The diode includes an N+ region which serves as the cathode and which is formed within a tub of P-type material, which serves as the anode. The N+ region is separated from the trench. The anode of the temperature detection diode may be shorted to the source or may be separately biased. The temperature of the MOSFET is monitored by supplying a current through the diode in the forward direction and measuring the voltage across the forward-biased diode. In an alternative embodiment, a pair of N+ regions are formed within the P-tub, constituting a diode pair, and the temperature is detected by monitoring the difference in the voltages across the diodes. An overtemperature detection unit compares the voltage across the diode or diodes with a reference voltage and provides an output which can be used to turn the MOSFET off when the temperature reaches a predetermined level.

31 Claims, 26 Drawing Sheets

TRENCH-GATED MOSFET WITH INTEGRAL TEMPERATURE DETECTION DIODE

This application is a continuation of application Ser. No. 08/537,959, filed Oct. 2, 1995 now Abandoned.

FIELD OF THE INVENTION

This invention relates to vertical trench-gated MOSFETs and, in particular, to circuitry for detecting the temperature of such a MOSFET.

BACKGROUND OF THE INVENTION

Power MOSFETs can be damaged by overheating, which can be caused by excessive current flows, high ambient temperatures, or a combination of these factors. Monitoring the current flow through the MOSFET is not a satisfactory way of detecting an overtemperature condition because it is difficult to distinguish a short circuit condition, which might create excessive temperatures, from the large transient currents which may occur during the normal switching of the MOSFET. For example, current spikes resulting from the start-up of a motor or incandescent lamp or the charging of a capacitor can falsely trip an overcurrent detect circuit. If the MOSFET is momentarily shut off as a result of a false overcurrent indication, noisy or sporadic turn-off waveforms can result. In some cases, the start-up cycle can repeat indefinitely. When the MOSFET controls a motor, such operation results in a "stuck rotor" condition wherein the motor never reaches adequate torque to overcome stiction. On the other hand, in the event of a "soft short", the current may be large enough to cause overheating but not large enough to trigger the overcurrent detection circuitry.

Assuming a constant supply current, the voltage drop across a forward-biased diode is inversely proportional to the ambient temperature. Hence, it is known to measure temperature by detecting the voltage across a forward-biased diode.

In lateral power MOSFETs a temperature sensing component may be integrated into the substrate, which is often set at some fixed potential such as ground. With vertical power MOSFETs, however, the substrate is normally the drain, whose potential moves up and down. Thus, a temperature detection diode in the drain must move up and down or it will interfere with the operation of the device. Fabricating such a structure and providing the proper drive circuit to sense the voltage even during switching is difficult. Prior art efforts focused on finding ways around this complication.

In some cases, the temperature detection diode is mounted on the same heat sink or metal trace as a vertical power MOSFET. For example, FIG. 1 shows a vertical MOSFET 10 which is mounted together with a temperature detection diode 11 on a leadframe or metal trace 12 which links the drain of MOSFET 10 to the anode of diode 11. A wire 15 connects to the source of MOSFET 10, and a wire 17 connects to the cathode of diode 11. The problem with this arrangement is that, while diode 11 measures the temperature of trace 12, the heat is mainly generated within a thin epitaxial (epi) layer at the top of MOSFET 10. Because the heat generated in the epi layer must flow downward through the substrate, the temperature in the active region of the MOSFET may be substantially higher than the temperature of the trace. As a result, the temperature within the MOSFET 10 may reach dangerous levels without being detected by diode 11. The MOSFET may incur permanent damage before it is shut off.

In FIG. 2, which is a cross-sectional view of a MOSFET 13, the temperature detector is integrated into the MOSFET. MOSFET 13 is a vertical device which includes cells 14A, 14B and 14C formed in an N-epitaxial (epi) region 16. N+ substrate 18 represents the drain of MOSFET 13. Temperature detection diode 20 includes a P region 22 and N region 24 which are typically formed in polysilicon. Diode 20 is electrically isolated from the substrate by a field oxide region 26. The problem with this type of arrangement is that the fabrication of the PN diode in polysilicon adds process steps, complexity, cost and possibly defect-related yield problems. Moreover, a significant thermal gradient (e.g., 30–40° C.) may occur across the field oxide region 26, and therefore this arrangement has some of the same delay problems as the arrangement shown in FIG. 1. Reducing the thickness of the oxide layer cannot entirely eliminate the temperature gradient. Diode 20 may also be sensitive to electrostatic discharges between it and the substrate and to voltage transients within MOSFET 13. Moreover, a region of high electric fields may by created in the underlying silicon, and this can lead to a reduction in the voltage-blocking capability of the device. The polysilicon diode approach has therefore not been successful in the thermal protection of power MOSFETs.

What is needed is a vertical power MOSFET with a reliable integral temperature sensor which does not degrade the device's electrical performance and which can be used in tandem with a control circuit to shut the MOSFET down in the event of an overtemperature condition. In addition, fabricating the temperature sensor should be uncomplicated and should require no or minimal additional masking steps.

SUMMARY OF THE INVENTION

In accordance with this invention, a temperature detection diode is integrally fabricated within a trench-gated MOSFET. The MOSFET includes a substrate of a first conductivity type, which forms the drain, a body region of a second conductivity type, and a source region of the first conductivity type. In one embodiment, the body region formed as part of a deep diffusion or "tub" of the second conductivity type which is used to provide protection against gate oxide breakdown at the corners of the trench, as taught in U.S. Pat. No. 5,072,266 to Bulucea. In another embodiment, the protective tub is formed in an inactive cell of the MOSFET, as described in application Ser. No. 08/459,555, filed Jun. 2, 1995, incorporated herein by reference.

A deep diffusion or tub of the kind taught in the above-referenced Bulucea patent is formed in an area of the MOSFET outside of the active MOSFET cells. A region of the first conductivity type is formed within the tub, creating a temperature detection diode at the junction therebetween. The tub represents one terminal of the diode, and the enclosed region of first conductivity type represents the other terminal of the diode. Since the tub need be only moderately doped to protect the gate oxide, the PN junction between the tub and the region of first conductivity is not leaky or degenerate, and a useable diode is formed integral to the MOSFET. The tub can be connected to the source of the MOSFET or it can be separately contacted. The tub is preferably formed during the same process step as the deep diffusions described in the above-mentioned Bulucea patent, and the enclosed region of first conductivity is preferably formed during the same process step as the source regions of the MOSFET. Thus, no additional processing steps are required.

The voltage drop across the temperature detection diode, when forward-biased at a known current, is used to determine the temperature of the MOSFET.

In another embodiment, a pair of diodes are formed in the tub, and currents of different densities are supplied to the diodes. The temperature is then determined by detecting the difference between the voltage drops across the diodes.

In accordance with another aspect of this invention, circuitry is provided for generating a current in the forward direction through the temperature detection diode. In one embodiment, this circuitry includes a bias generator which provides a voltage supply for a current source. The current source supplies a constant current to the temperature detection diode. The bias generator includes a charge pump which is supplied by the gate and source or the drain and source terminals of the MOSFET.

In one embodiment, the charge pump includes an oscillator; in another embodiment, where the MOSFET is continually switching, the oscillator is omitted and the charge pump is driven directly by the voltages at the terminals of the MOSFET.

In the preferred embodiment, the voltage across the temperature detection diode is amplified and delivered to an input of a comparator, where it is compared against a reference voltage. When the voltage across the temperature detection diode reaches a predetermined level, the output of the comparator changes, and this changed signal is used to turn the MOSFET off or to communicate with a host control IC or microprocessor to shut down the gate.

In accordance with yet another aspect of the invention, the bias generator is used to generate a second voltage, which in turn is used to shift the output of the comparator to a desired level. The level-shifted signal is used to turn the MOSFET off.

DESCRIPTION OF THE INVENTION

Figure 2:
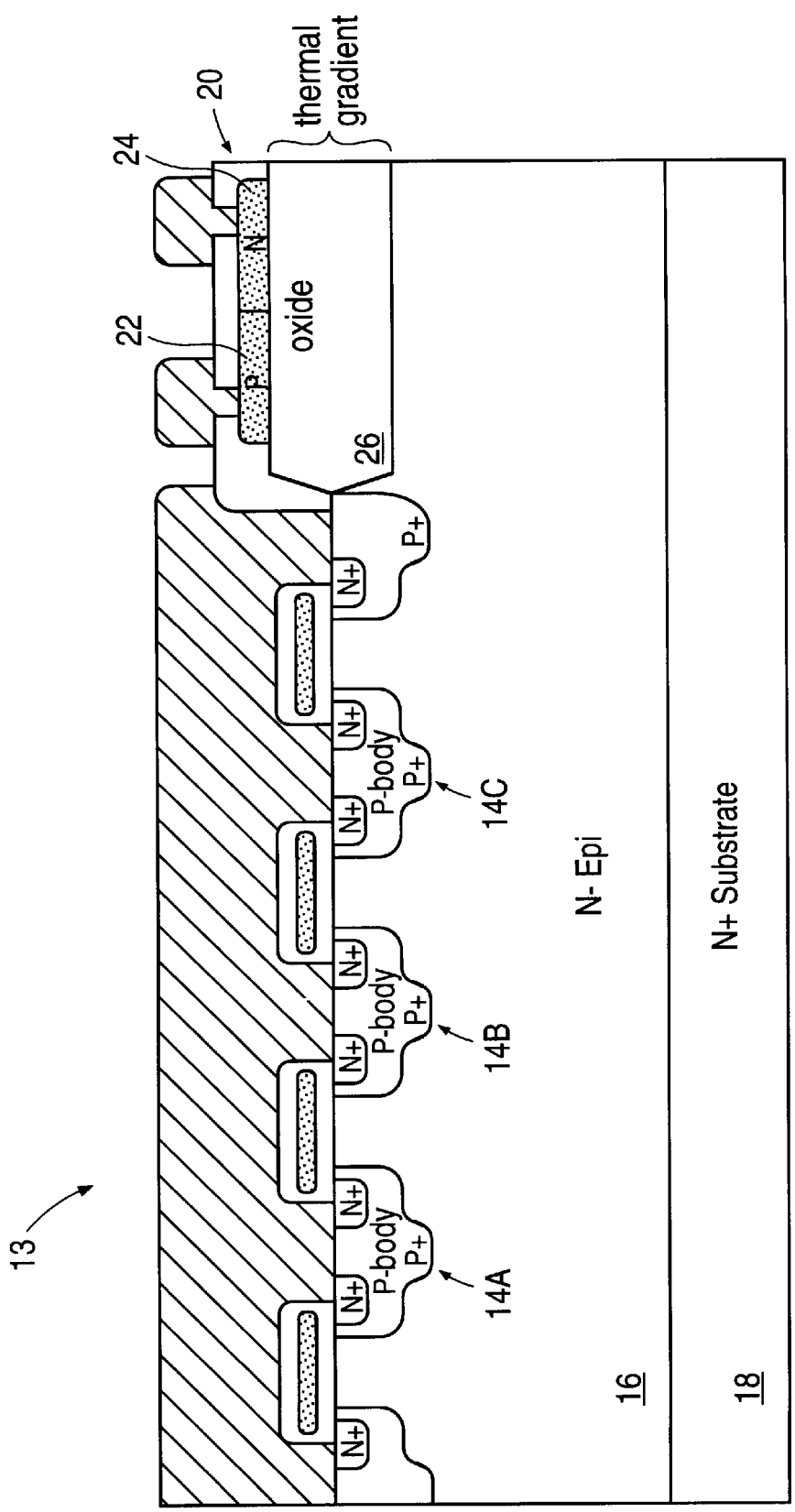
FIG. 2 illustrates a cross-sectional view of a MOSFET which includes a temperature detection diode located over a field oxide region.
Figure 3:
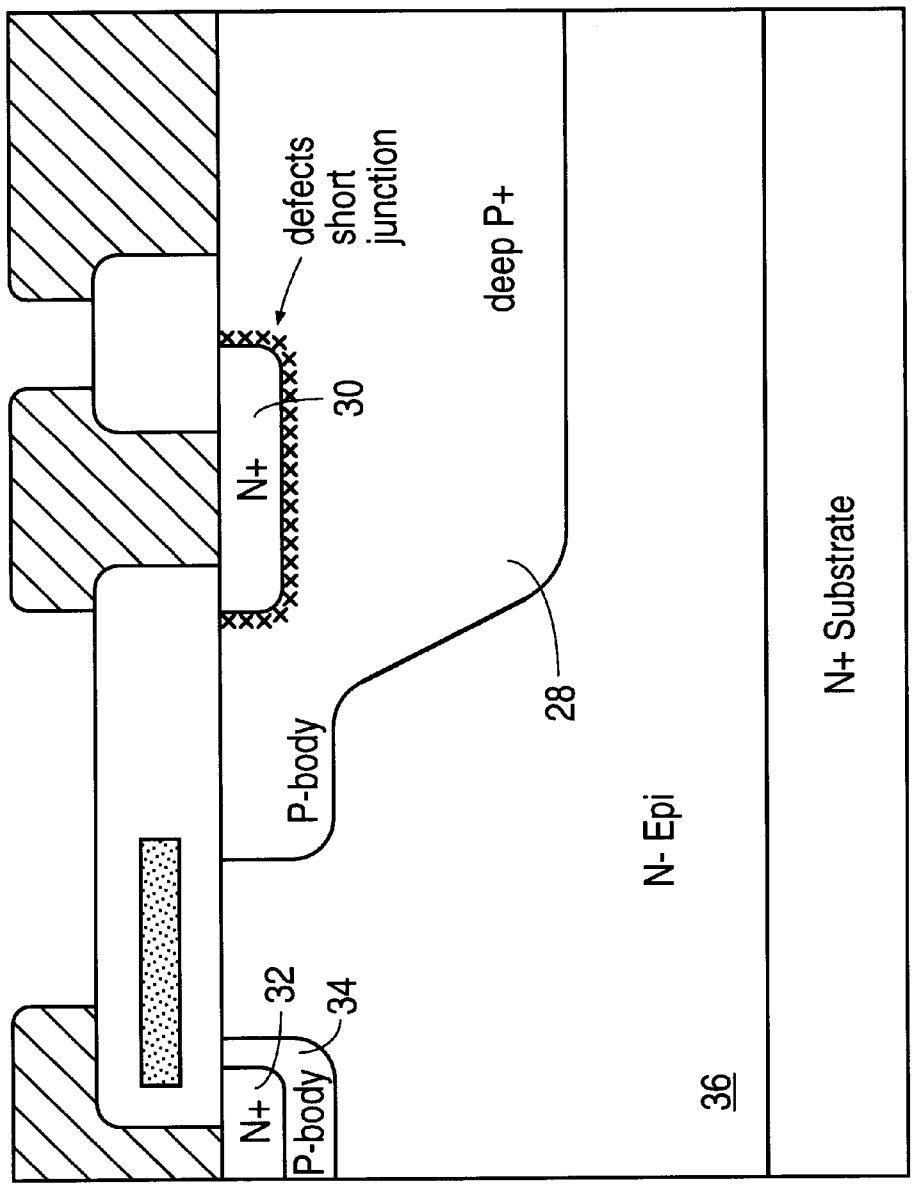
FIG. 3 illustrates a cross-sectional view of a MOSFET which includes a hypothetical temperature detection diode having a degenerate PN junction.

The MOSFET of this invention includes an integral temperature detection diode. The invention will be made more understandable by reference to FIGS. 3–5, which illustrate problems that might be encountered in integrating the diode into the MOSFET. FIG. 3 illustrates a problem that would occur by using a PN diode consisting of deep P+ region 28 and N+ region 30. The deep P+ region 28 is similar to the deep P+ regions shown in FIG. 2, which are used to prevent conduction in the parasitic NPN transistors formed by the source, body and drain in the ordinary MOSFET cells. (See, for example, U.S. Pat. No. 4,642,666 to Lidow.) The doping of the deep P+ region in a typical quasi-vertical device is extremely high (in the range of $10^{19}$ cm$^{-3}$ or more). Thus, unless a separate masking step is used for P+ region 28, the junction between P+ region 28 and N+ region 30 will be leaky (or shorted) and unsuitable for use as a temperature detector.

Figure 4:
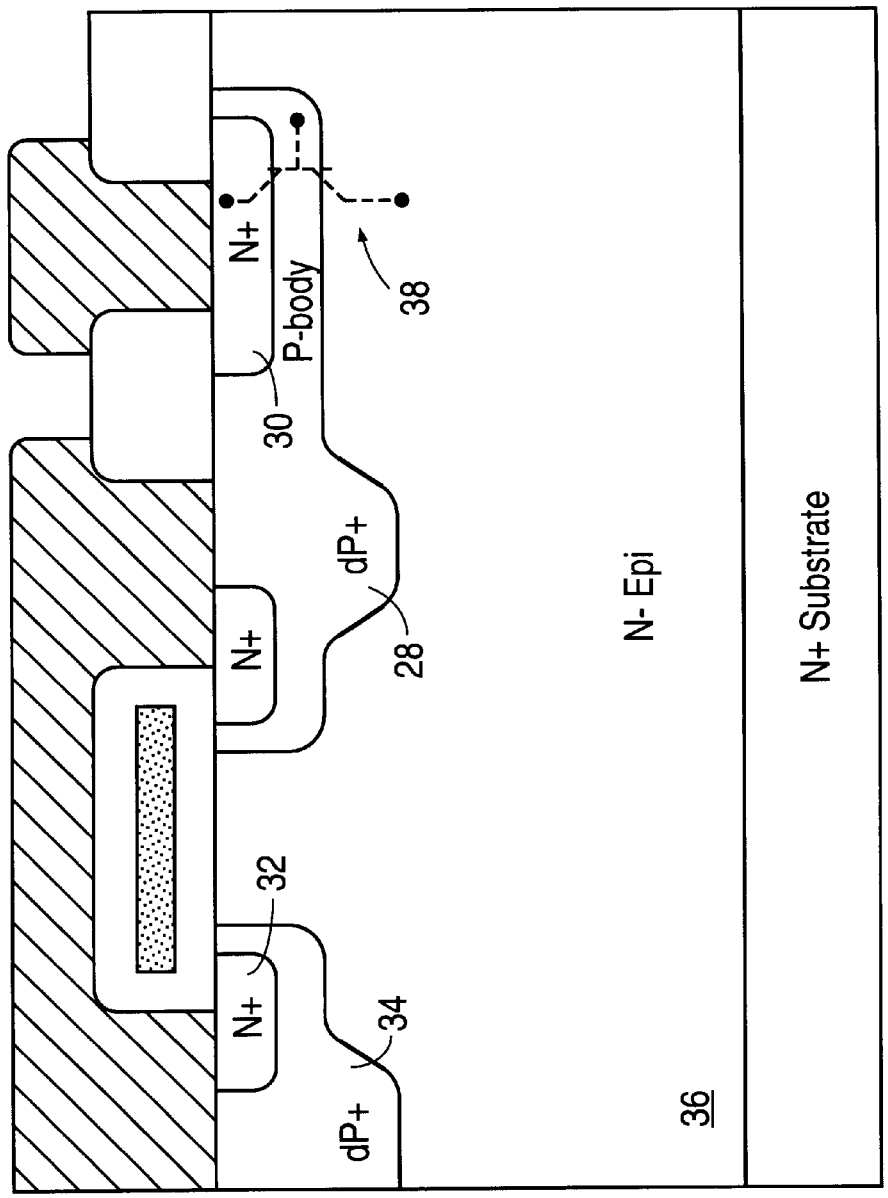
FIG. 4 illustrates a cross-sectional view of a MOSFET wherein a hypothetical temperature detection diode forms a parasitic bipolar transistor.

Moving the N+ region laterally away from the deep P+ region, as shown in FIG. 4, would create a parasitic bipolar transistor, indicated by the reference numeral 38. Bipolar transistor 38 would typically have a snapback voltage in the range of 10 to 15 volts. Bipolar snapback can lead to a loss of blocking capability, sensitivity to transients, uneven current distributions and, potentially, destruction of the MOSFET. Moreover, the risk that parasitic bipolar transistor 38 will turn on, producing impact ionization and a large surge of drain current, militates against the use of a PN diode of the kind shown in FIG. 4 to detect temperature. As noted above, a temperature detection diode is normally supplied with constant current. The addition of a large drain current can generate excessive heat and corrupt the temperature measurement process.

Figure 5:
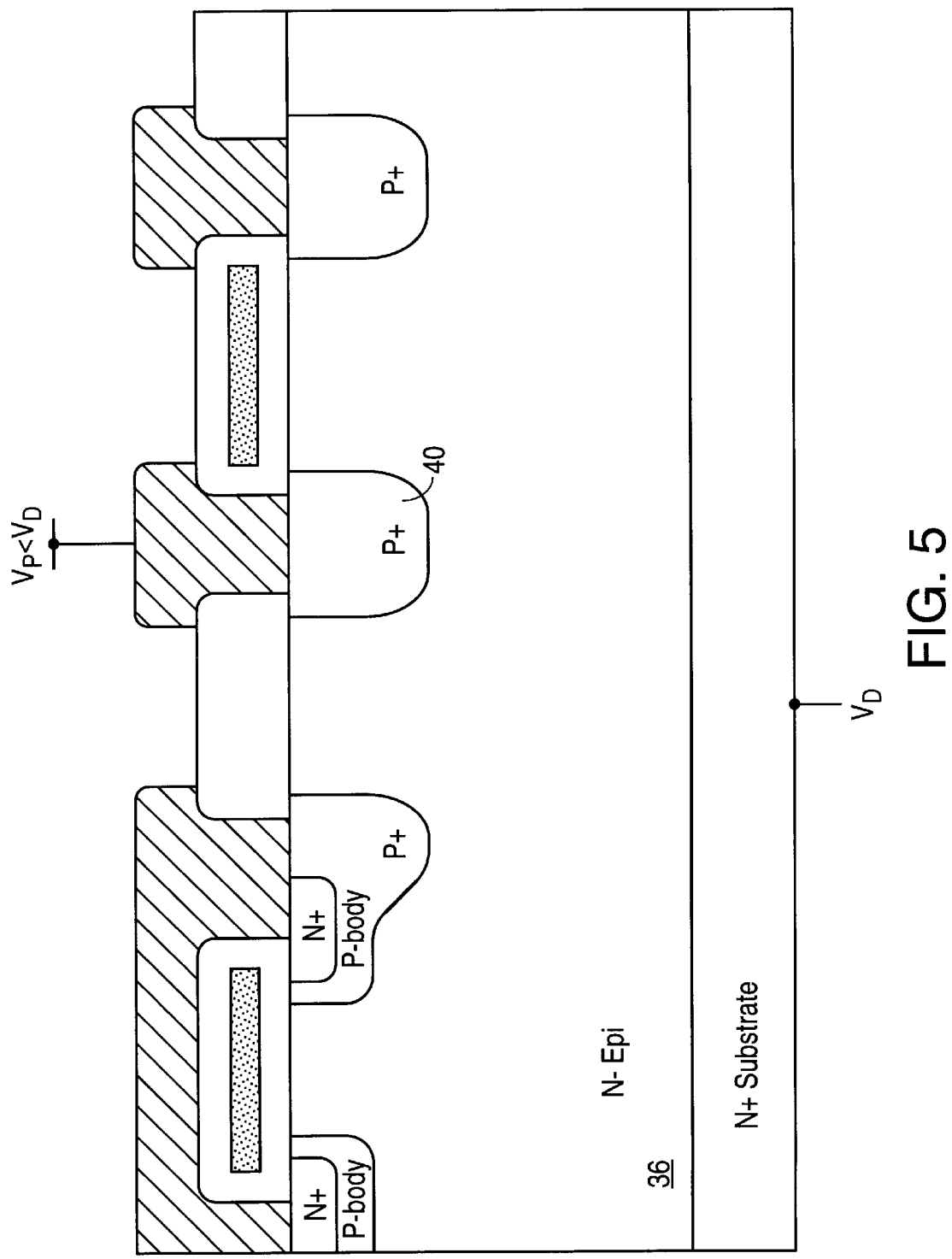
FIG. 5 illustrates a cross-sectional view of a MOSFET used in lieu of a diode as a temperature detection device.

Using a P-channel device, such as the one shown in FIG. 5, to prevent the formation of the parasitic NPN transistor is not acceptable because the drain voltage $V_D$ is normally higher than the source voltage. To prevent forward biasing the drain-to-epi diode, the MOSFET would have to "float" with the drain potential, making the sense circuitry complex. Furthermore, a MOSFET does not make a good temperature monitor, since its threshold voltage depends on both temperature and process variables.

Figure 6:
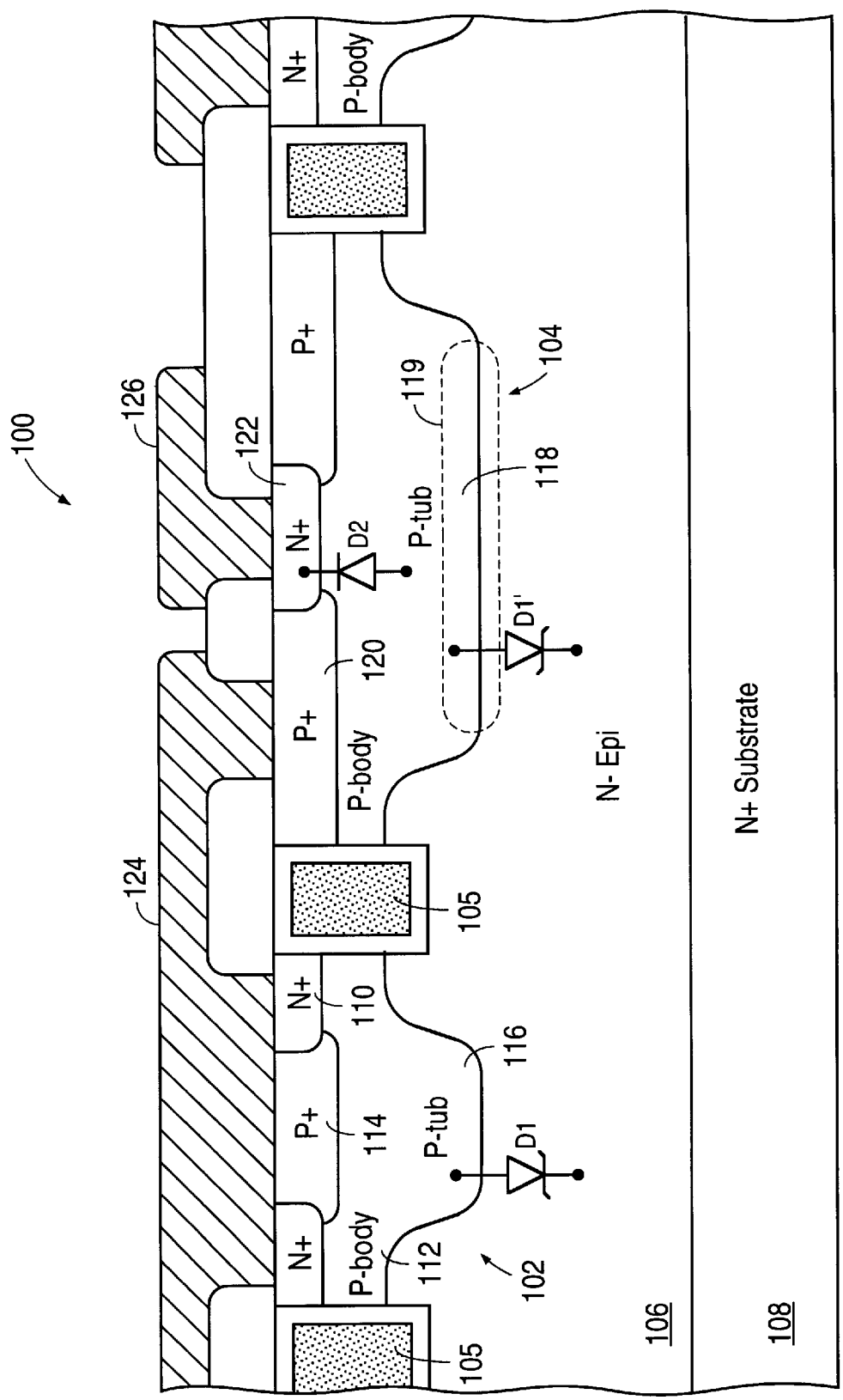
FIG. 6 illustrates a cross-sectional view of a MOSFET including an integral temperature detection diode which includes an N+ region formed in a P-tub.

The temperature sensor of this invention is formed in a trench-gated MOSFET of the kind illustrated in cross-section in FIG. 6. N-channel MOSFET 100 includes a conventional MOSFET cell 102 which is bordered by a gate 105. MOSFET 100 is formed in an N-epi region 106 that is grown on an N+ substrate 108. N+ substrate 108 forms the drain of the device.

Cell 102 includes an N+ source region 110, a P-body 112 and a P+ body contact region 114. In accordance with U.S. Pat. No. 5,072,266 to Bulucea, MOSFET cell 102 includes a deep P-tub 116 which protects the gate oxide (not numbered) from breakdown as a result of the high electric field which occurs at the corners of the trenches.

MOSFET 100 also includes a cell 104 which does not function as a normal cell but instead includes the temperature detection diode. Cell 104 is shown as larger than cell 102, but this need not be the case. Cell 104 includes a P-tub 118 which is formed in the same process step as P-tub 116. Included within P-tub 118 are a P+ contact region 120 (which is optional) and a N+ region 122. Preferably, N+ region 122 and N+ source 110 are formed with the same N+ implant, and P+ region 120 is formed during the same implant as P+ region 114.

Also shown in FIG. 6 are a source/body metal contact 124 (which also contacts P+ region 120) and a cathode metal contact 126, which contacts N+ region 122. A drain contact (not shown) makes contact with N+ substrate 108. In FIG. 6, the junction between P-tub 116 and N-epi 106 is represented as a diode D1, and the junction between P-tub 118 and N-epi 106 is represented as a diode D1'. The junction between P-tub 118 and N+ region 122 is represented as a diode D2, which is the temperature detection diode. For reasons explained below, a region 119 of higher dopant concentration may be provided in the diode cell 104 and optionally in the active MOSFET cell 102.

Figure 7:
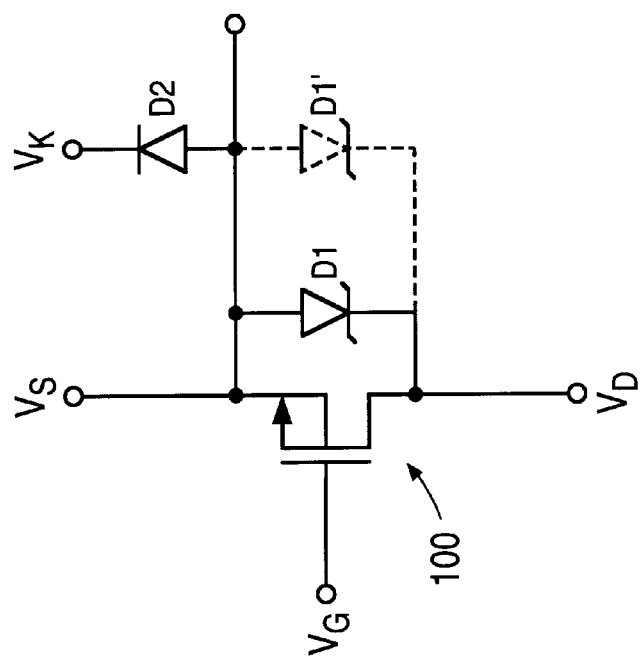
FIG. 7 illustrates an equivalent circuit diagram for the MOSFET shown in FIG. 6.

An equivalent circuit for MOSFET 100 is shown in FIG. 7. $V_S$ represents the source potential, $V_D$ represents the drain potential and $V_G$ represents the gate potential. $V_K$ represents the bias applied to the cathode of temperature detection diode D2, and it is apparent that $V_K$ must be below $V_S$ for temperature detection diode D2 to be forward-biased.

Figure 1:
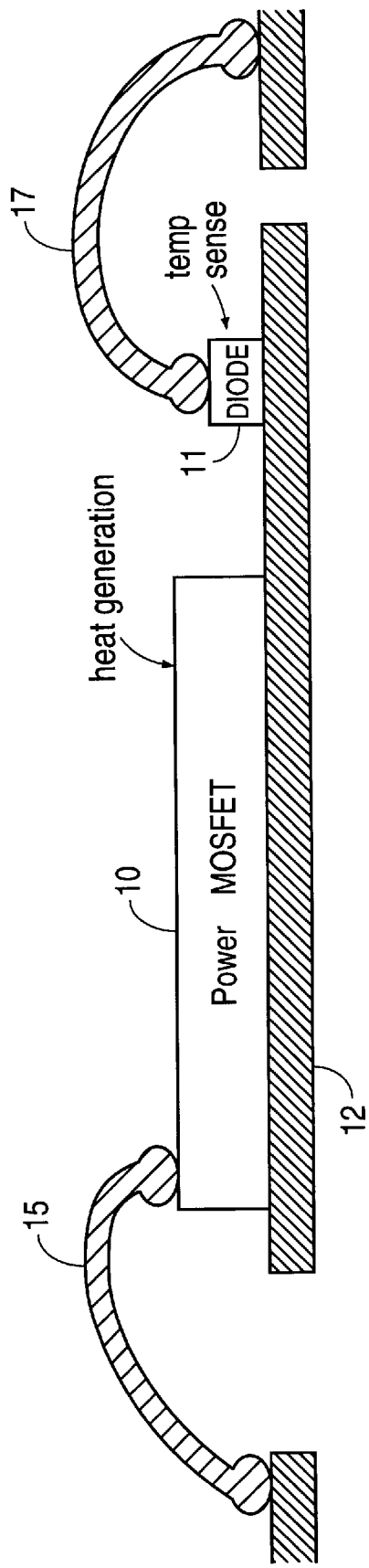
FIG. 1 illustrates a temperature detection diode that is mounted on a metal trace or leadframe.

As is customary in an N-channel device, the drain voltage $V_D$ is normally higher than the source voltage $V_S$. Thus, diode D1' is normally reverse-biased. Moreover, the depth of P-tub 118 inhibits the turn-on of a parasitic bipolar transistor (comparable to transistor 38 shown in FIG. 4); and the fact that P-tub 118 need not be extremely heavily doped maintains the integrity of the PN junction between P-tub 118 and N+ region 122, i.e., this junction is not degenerate or leaky like the junction between deep P+ region 28 and N+ region 30 shown in FIG. 3. Thus temperature detection diode D2 is a proper functioning diode which is integral to MOSFET 100 and can therefore be used to detect the temperature within MOSFET 100 without the delay associated with the diodes shown in FIGS. 1 and 2.

Another aspect of this invention is the intentional separation of the N+ cathode 122 from the trench gates 105. Regardless of whether the P+ contact region 120 overlaps or is separated from the N+ cathode region 122, or is omitted altogether, the separation of the N+ cathode 122 and the trench gate 105 prevents the formation of a parasitic sidewall channel through vertical MOSFET action. If MOSFET conduction occurs in the temperature detection cell 104, producing a behavior similar to that in a normal MOSFET cell, the MOSFET current will interfere with the conduction of the temperature detection diode D2, by shunting the current from the diode D2 into the channel of the MOSFET. This will produce an erroneous reading of the voltage across diode D2 ($V_{be}$) for a given cathode current and ultimately an incorrect temperature reading.

To further reduce the risk of parasitic bipolar turn-on, boron may be implanted at an energy of 300 keV to 3 MeV (1 MeV being preferred) and a dose of $5 \times 10^{13}$ to $5 \times 10^{15}$ cm$^{-2}$ ($5 \times 10^{14}$ cm$^{-2}$ being preferred) immediately before the N+ implant for the source 110 and diode cathode (region 122), or after the N+ implant but before the N+ dopant is driven in. The result is to increase the concentration of P-type material in P-tub 118 at least 0.5 $\mu$m below the surface of the silicon, away from the junction with N+ region 122. This P+ region is identified by the dashed line and reference numeral 119 in FIG. 6. In this manner, the problems of a leaky, degenerate PN junction between P-tub 118 and N+ region 122 are avoided, while the increased concentration of P-type dopant in the base of the parasitic NPN transistor reduces the $\beta$ of the transistor. As a result of recombination between the holes in P+ region 119 and any electrons injected by the collector of the parasitic bipolar transistor (i.e., the drain of the MOSFET), very little of the emitter current will end up in the collector. By reducing the parasitic collector current, the increase in drain current due to impact ionization at high drain biases can be avoided. As described further below, impact ionization occurs within the space charge region of diode D1' whenever diode D2 is forward biased.

Figure 8:
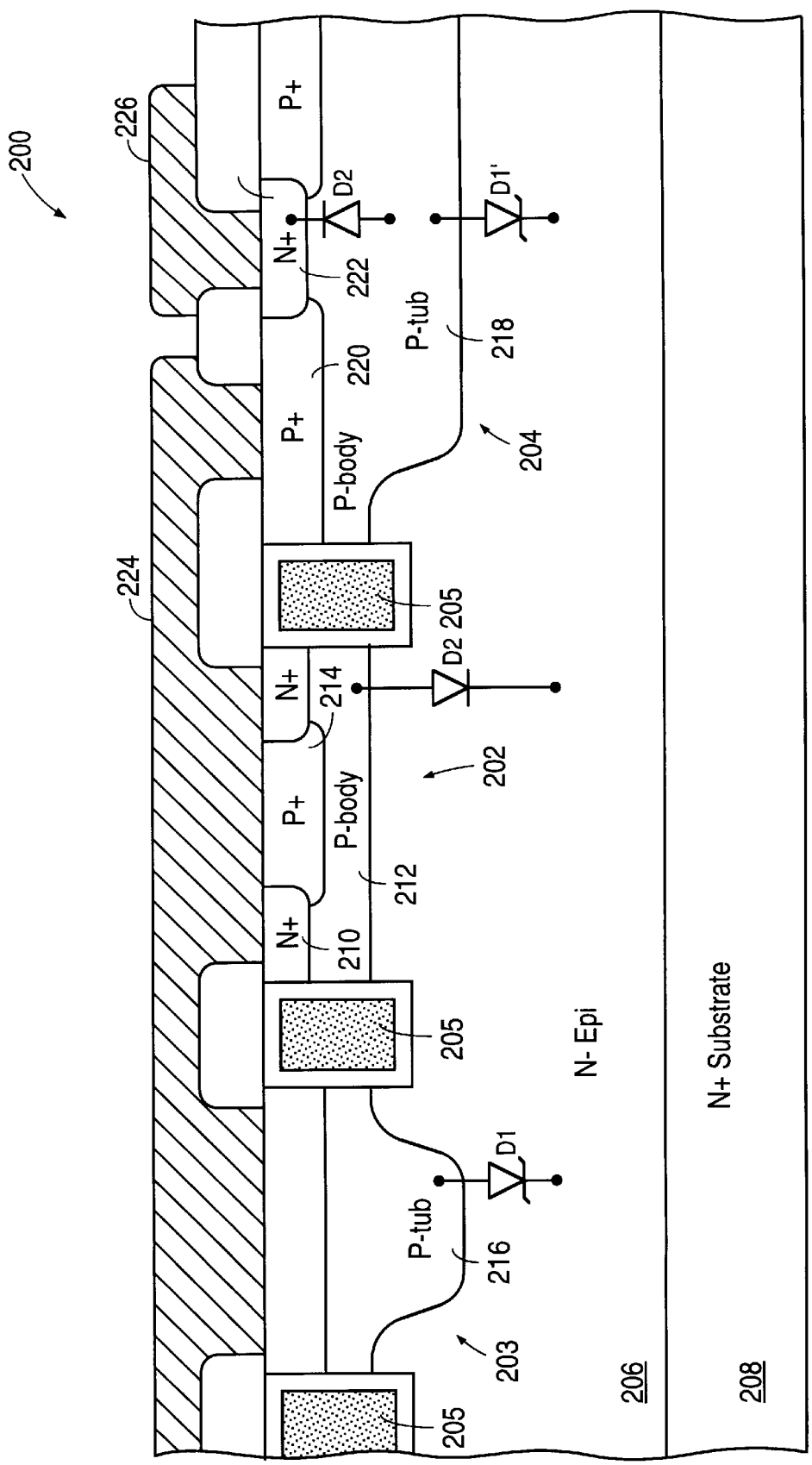
FIG. 8 illustrates a cross-sectional view of an embodiment in which the P-tub is formed in a inactive cell of the MOSFET.

FIG. 8 illustrates a MOSFET 200 according to a second embodiment of this invention. MOSFET 200 includes a cell 204 which contains a diode D2 and is structurally and functionally similar to cell 104 shown in FIG. 6. However, the active MOSFET cell 202 does not include a P-tub. Instead a P-tub 216 is included in a second protective cell 203, which is inactive. The junction between P-tub 216 and N-epi layer 201 is represented by diode D1 which clamps $V_D$ to $V_S$ at some predetermined voltage, as described in application Ser. No. 08/459,555, filed Jun. 2, 1995, incorporated herein by reference in its entirety. Preferably, there is one protective cell (similar to cell 203) for every N active MOSFET cells (similar to cell 202). During avalanche breakdown, the protective cells carry the current and clamp the drain voltage to minimize the maximum electric field and impact ionization in the active MOSFET cells. By excluding the P-tubs from the active cells, the cell density can be significantly increased, thereby reducing the on-resistance of the MOSFET.

Figure 9:
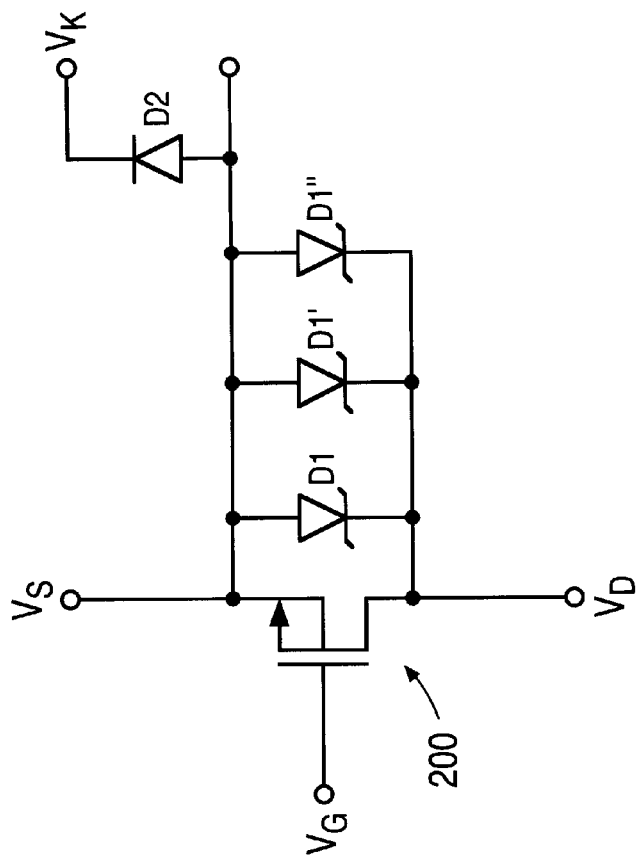
FIG. 9 illustrates an equivalent circuit diagram for the MOSFET shown in FIG. 8.

FIG. 9 illustrates an equivalent circuit for MOSFET 200. The operation of the temperature detection cell 204 is the same as operation, described above, of cell 104 in FIG. 6.

Figure 10:
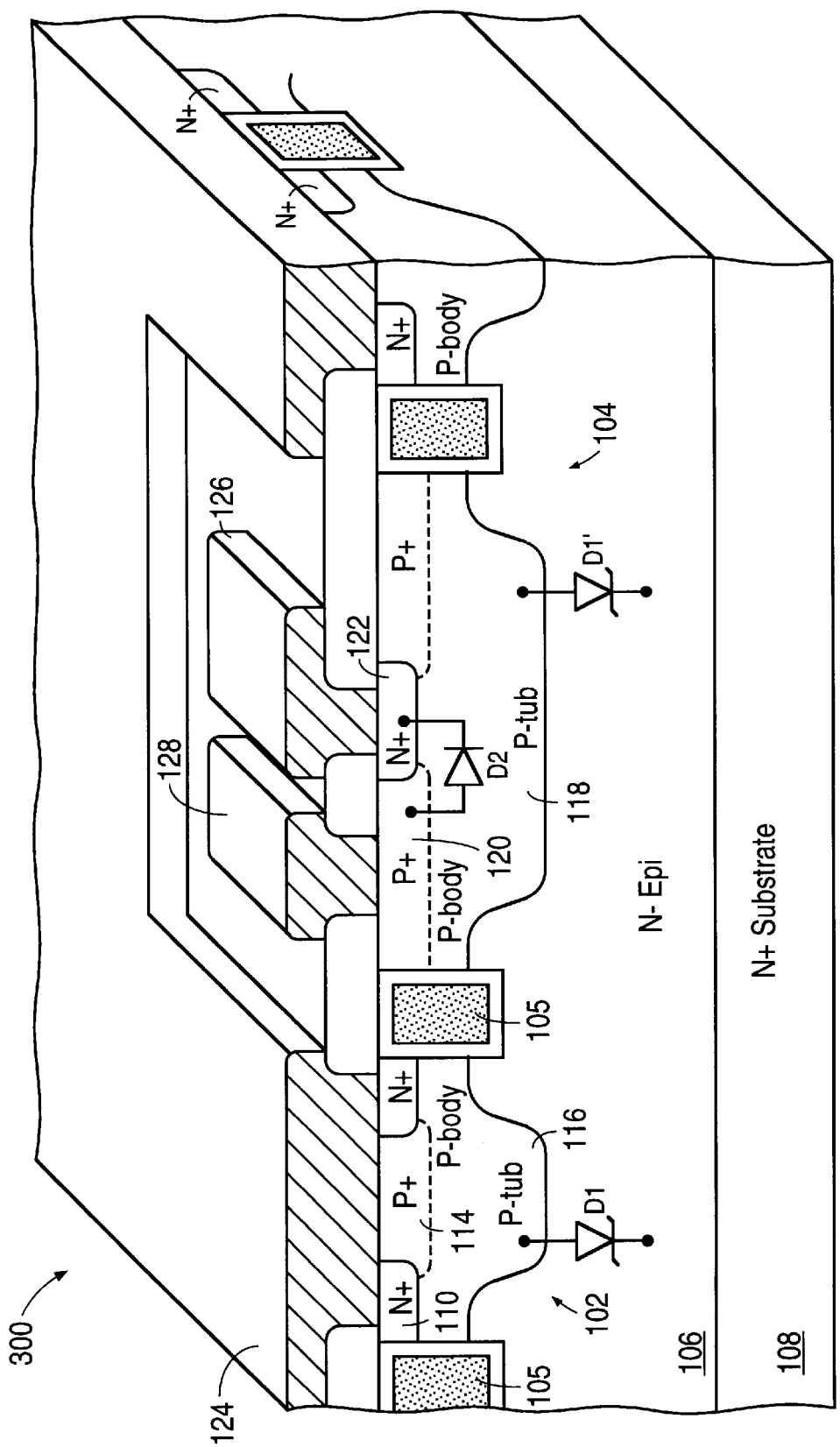
FIG. 10 illustrates a three-dimensional cross-sectional view of a MOSFET which includes a temperature detection diode whose anode is separately contacted.
Figure 11:
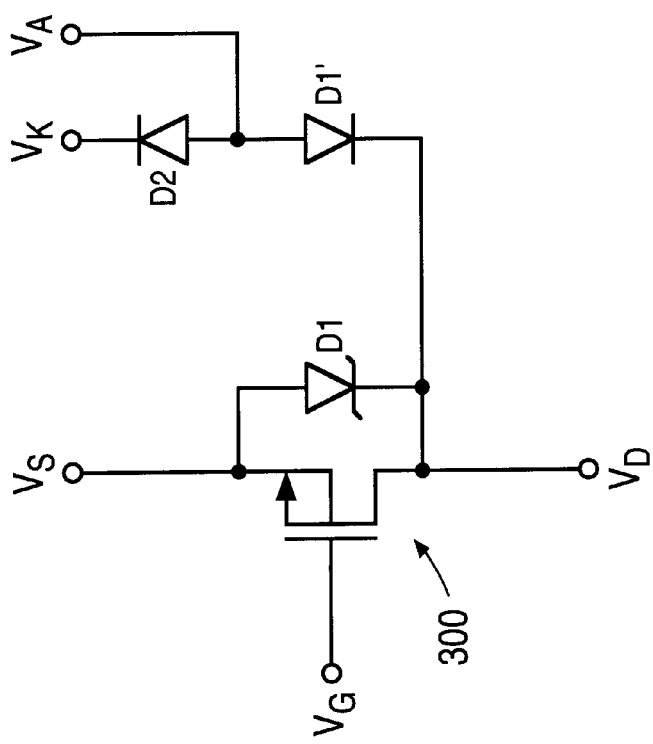
FIG. 11 illustrates an equivalent circuit diagram for the MOSFET shown in FIG. 10.

A third embodiment is shown in FIG. 10. MOSFET 300, which is shown in a three-dimensional cross-sectional view, is identical to MOSFET 100, except that the anode of the temperature detection diode D2 is not connected to the source terminal of the MOSFET. Instead, a metal contact 128 is used to bias the anode of diode D2. The advantage of this arrangement is that it isolates diode D2 from any noise that may be generated by transients at the source terminal of the MOSFET. Also, the biasing of diode D2 is made more flexible because the cathode of diode D2 need not be referenced to the source voltage $V_S$. The equivalent circuit for MOSFET 300 is shown in FIG. 11, wherein the voltage at the anode of diode D2 is designated $V_A$.

Figure 12:
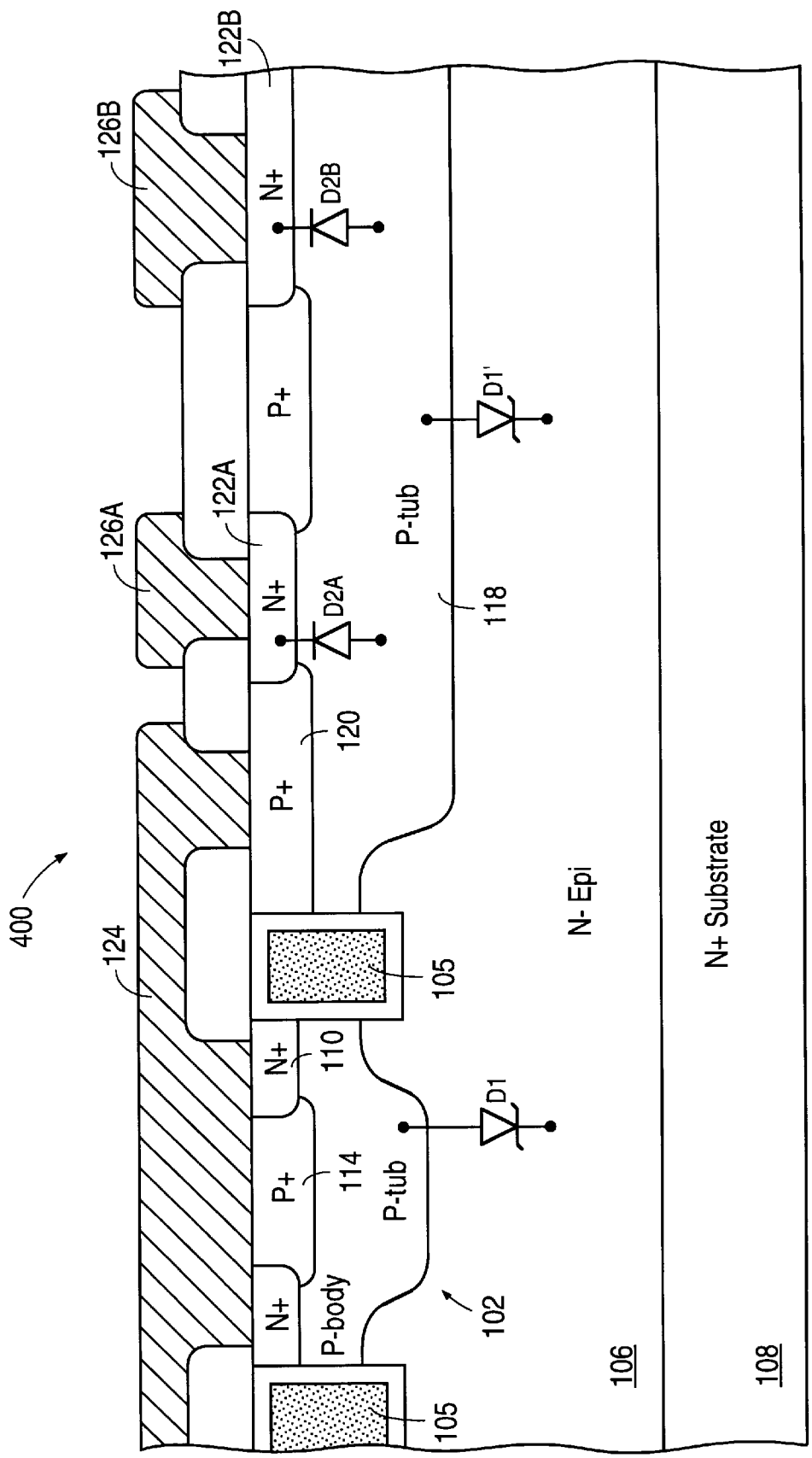
FIG. 12 illustrates a cross-sectional view of a MOSFET which contains a pair of temperature detection diodes.

FIG. 12 illustrates a cross-sectional view of a MOSFET 400 in accordance with a fourth embodiment of the invention. MOSFET 400 is similar to MOSFET 100 except that P-tub 118 contains two N+ regions 122A and 122B. Separate metal contacts 126A and 126B make contact with N+ regions 122A and 122B, respectively. As a result, two temperature detection diodes D2A and D2B are formed within P-tub 118. Diodes D2A and D2B may be of different sizes or they may be supplied with currents of different magnitudes, or both. Since (as described below) the difference between the voltage drop across diode D2A and the voltage drop across diode D2B varies with temperature, this difference in voltages ($\Delta V = V_{KA} - V_{KB}$) can be used to determine the temperature of MOSFET 400 ($V_{KA}$ being the voltage across diode D2A and $V_{KB}$ being the voltage across diode D2B). By reading this differential signal, any effects from the capacitance of the reverse-biased diode D1' are eliminated. In other words, any currents resulting from a build up of charge across diode D1', as the drain voltage $V_D$ fluctuates, affect diode D2A and D2B equally.

Figure 13:
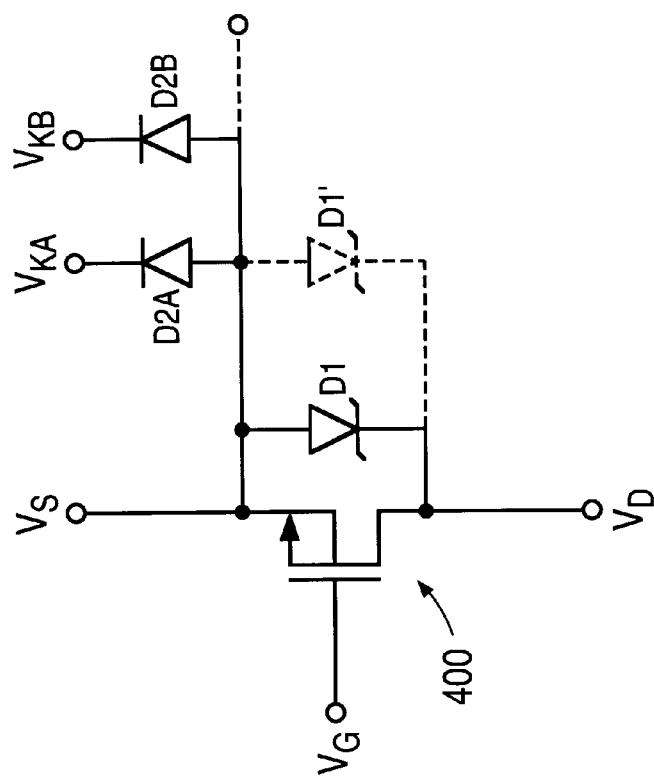
FIG. 13 illustrates an equivalent circuit diagram for the MOSFET shown in FIG. 12.

FIG. 13 illustrates an equivalent circuit for MOSFET 400.

Figure 14:
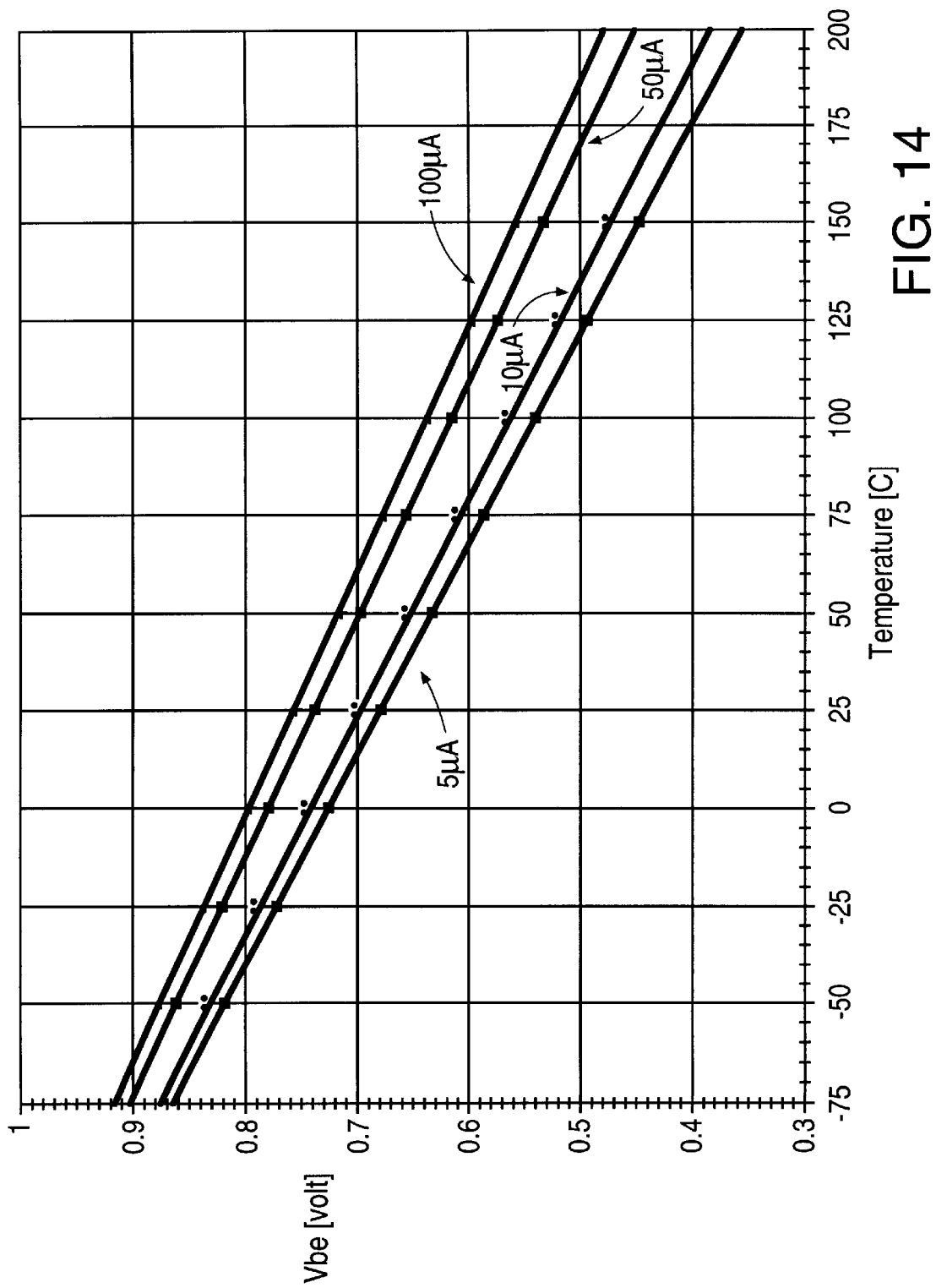
FIG. 14 illustrates a graph showing the voltage drop across a diode as a function of temperature at different levels of current.

In order to use a diode as a temperature sensor, it must be calibrated by determining the voltage drop across the diode as a function of temperature at a constant current. Alternatively, the voltage drop could be held constant and the current could be measured as a function of temperature. FIG. 14 shows the experimentally measured voltage drop $V_{be}$ across two identical diodes as a function of temperature at the four different currents indicated (5 μA, 10 μA, 50 μA, and 100 μA) through each diode. As expected, $V_{be}$ increases with increasing current and decreases with increasing temperature. It should be noted that the constant current lines tend to spread out with increasing temperature. The following are the derived equations relating $V_{be}$ and temperature (T) from the test data shown in FIG. 14.

5 μA: $T = -532.9 * V_{be} + 387$

10 μA: $T = -551.5 * V_{be} + 409.5$

50 μA: $T = -598.6 * V_{be} 30\ 467.4$

100 μA: $T = -619.6 * V_{be} + 494.1$

Figure 15:
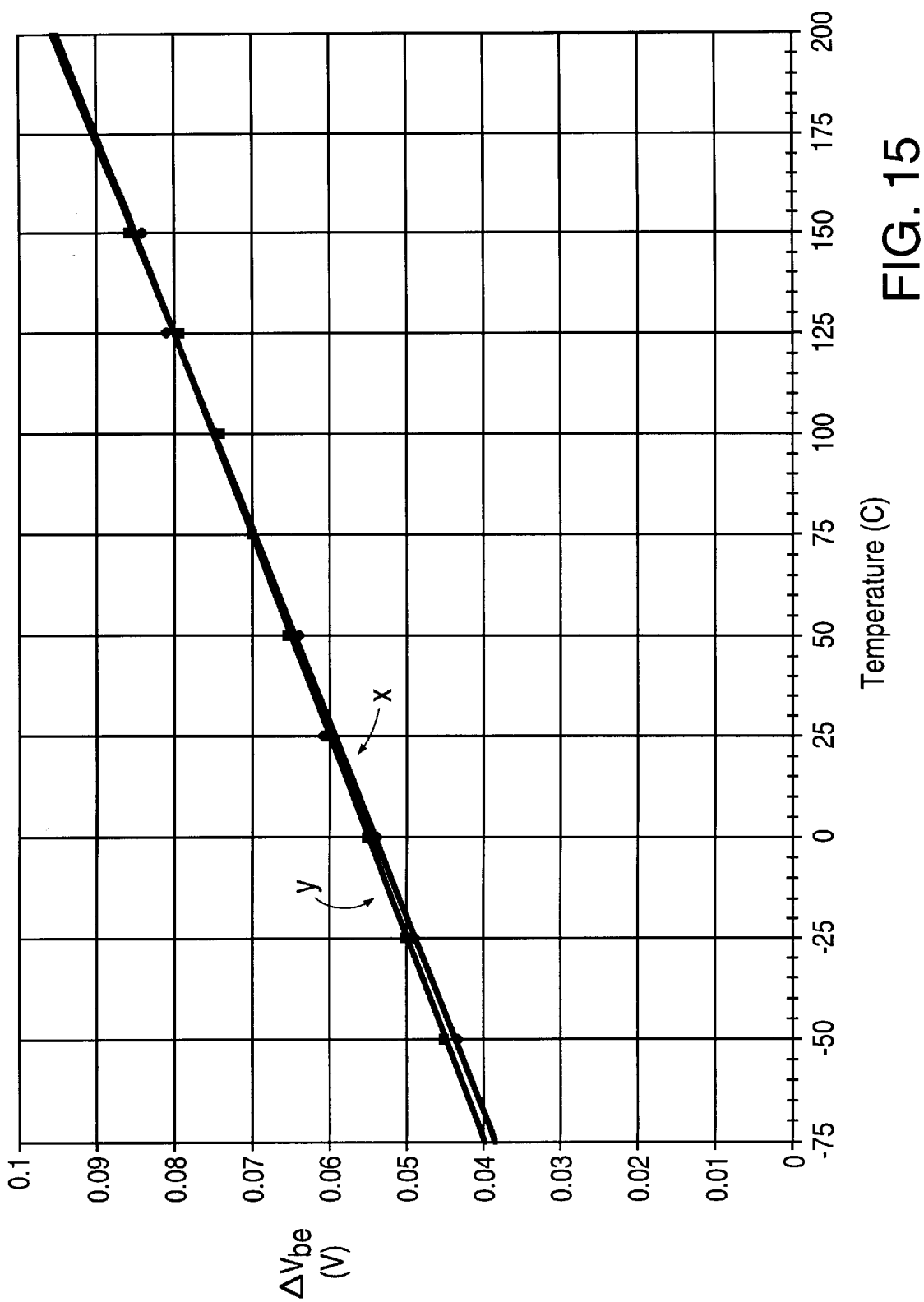
FIG. 15 illustrates a graph showing the difference between the respective voltages across a pair of diodes as a function of temperature when the currents through the diodes differ by a factor of ten.

FIG. 15 shows the difference in the voltage across the diode ($\Delta V_{be}$) as a function of temperature at two different current levels. The same two diodes used to develop the data shown in FIG. 14 were used. Curve X shows $\Delta V_{be}$ for currents of 5 μA and 50 μA. Curve Y shows $\Delta V_{be}$ for currents of 10 μA and 100 μA. Thus, for each curve the currents differ by a factor of 10, and it is noteworthy that the curves, while not coincident, are very close.

The data in FIG. 14 would be used to calibrate the temperature detection diode D2 in MOSFETs 100, 200 and 300 (FIGS. 6, 8 and 10) while the data in FIG. 15 would be used to calibrate the temperature detection diodes D2A and D2B in MOSFET 400 (FIG. 12).

Figure 16:
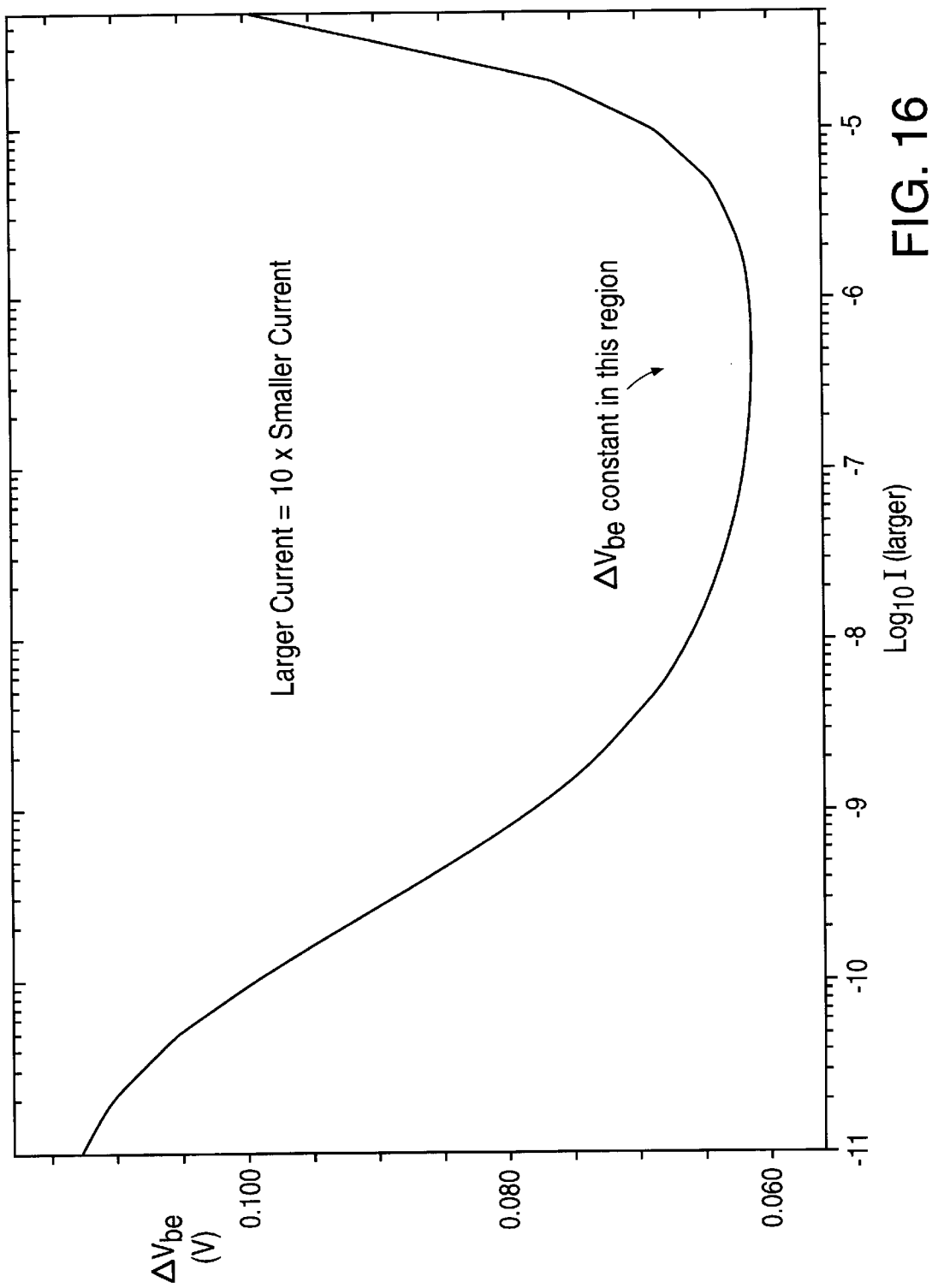
FIG. 16 illustrates a graph showing the difference between the respective voltages across a pair of diodes experiencing currents which differ by a factor of ten, as a function of the current density in the diode carrying the larger current.

As shown in FIG. 15, the plot of $\Delta V_{be}$ as a function of temperature is almost independent of the absolute value of the currents. Nonetheless, there is some variation with absolute current. FIG. 16, which was prepared using the two-dimensional device simulator MEDICI, shows $\Delta V_{be}$ as a function of the current density of the larger current. As in FIG. 15, the currents differed by a factor of ten. The horizontal axis of FIG. 16 is the $\log_{10}$ of the current density in amperes per μm of cathode length (in the third dimension). The curve in FIG. 16 has a minimum at $5 \times 10^{-7}$ A/μm and is reasonably flat in the region surrounding this value. Thus, diodes operated in this region would show little variation of $\Delta V_{be}$ with changes in the absolute value of the current. For example, assuming a cathode length of 90 μm, the larger current would be 45 μA and the smaller current 4.5 μA.

By forward-biasing the cathode of the temperature detection diode at a fixed value of current, the same current will ideally appear at the base terminal, and an accurate $V_{be}$ can be measured. Some of the carriers injected into the base will be collected by the drain of the MOSFET, thereby forming a parasitic bipolar NPN transistor. The result of the parasitic bipolar action is that a portion of the emitter current is diverted from the base to the parasitic collector. For a parasitic β of 4, for example, 80% of the current will become collector current and only 20% will be base current. If the emitter current is 0.5 μA/μm, this current division corresponds to a collector (drain) current of 0.4 μA/μm and a base current of 0.1 μA/μm. If this ratio is constant with collector (drain) voltage, then the error can be compensated for.

At high drain voltages, however, the value of $V_{be}$ can be influenced not only by parasitic bipolar action, but also by impact ionization within the collector of the parasitic bipolar transistor which can give rise to a increase in both base and collector currents. Impact ionization is a process whereby a sustained incremental leakage current occurs in a reverse-biased PN junction as a result of an interaction with some other current that is passing through the space charge region of the PN junction. The incremental leakage current is a current that is over and above the sum of the current resulting from the leakage of the junction (without the parasitic collector current) and the parasitic collector current (in the absence of impact ionization). The total leakage current depends on the applied voltage, the magnitude of the parasitic collector, and the alignment of the current and the region of high electric fields in the device.

Figure 17:
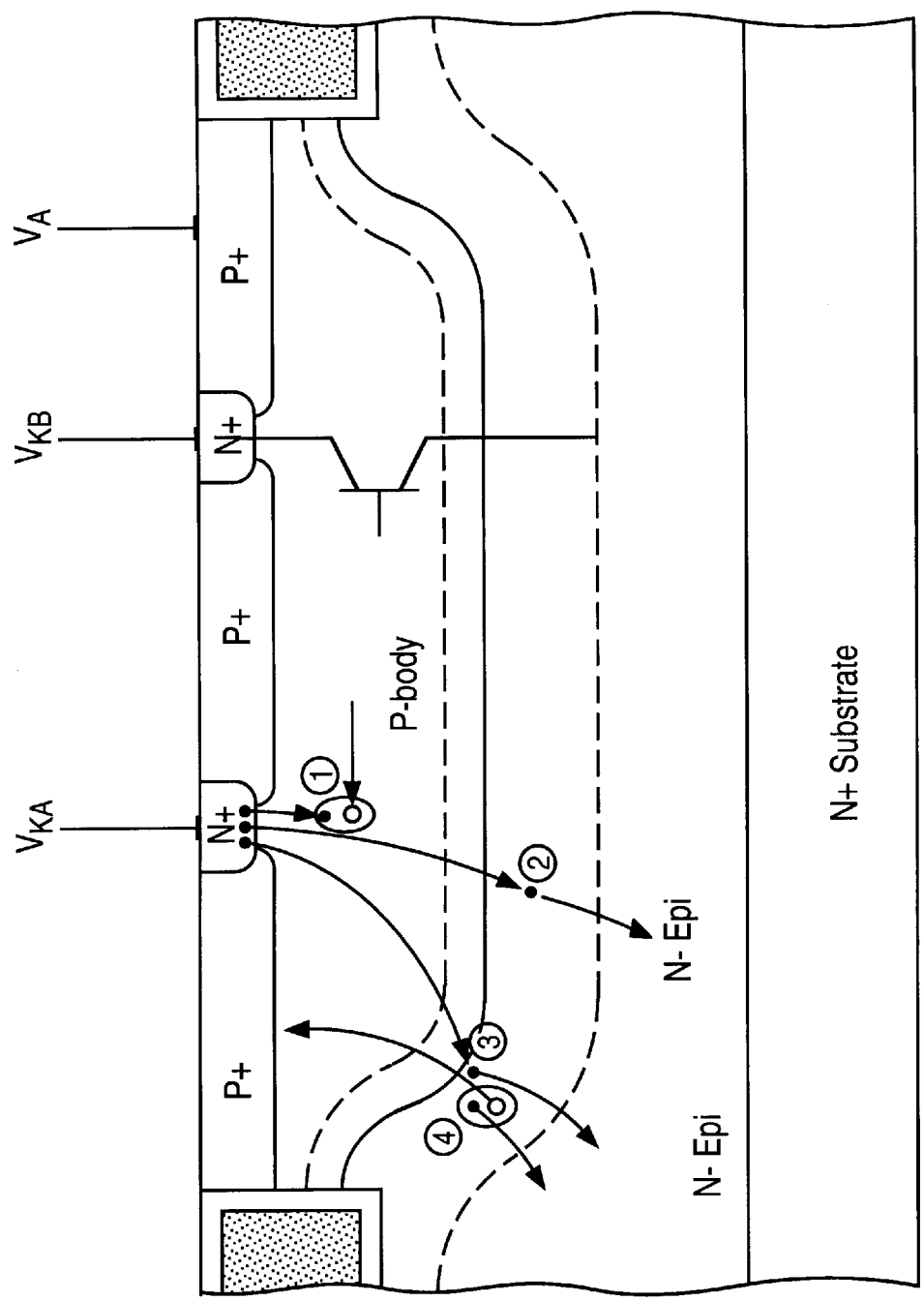
FIG. 17 illustrates the mechanism of impact ionization which occurs when the MOSFET experiences high drain voltages while the temperature detection diode is conducting.

FIG. 17 illustrates the mechanism of this interaction. Three possibilities are shown for electrons flowing from the cathode (N+ region) into the base (P-body). Electron #1 recombines with a hole in the base, producing only a base (diode) current. Electron #2 passes through the base into the collector/drain (N+ substrate) without recombining or colliding with other atoms. Electron #3 collides with an electron-hole pair with enough energy to split (ionize) the pair, thereby creating two additional carriers, a hole which flows towards the base and an electron which flows towards the collector. The newly generated carriers may in turn ionize additional electron-hole pairs. An incremental impact ionization current therefore flows through the diode.

Figure 18:
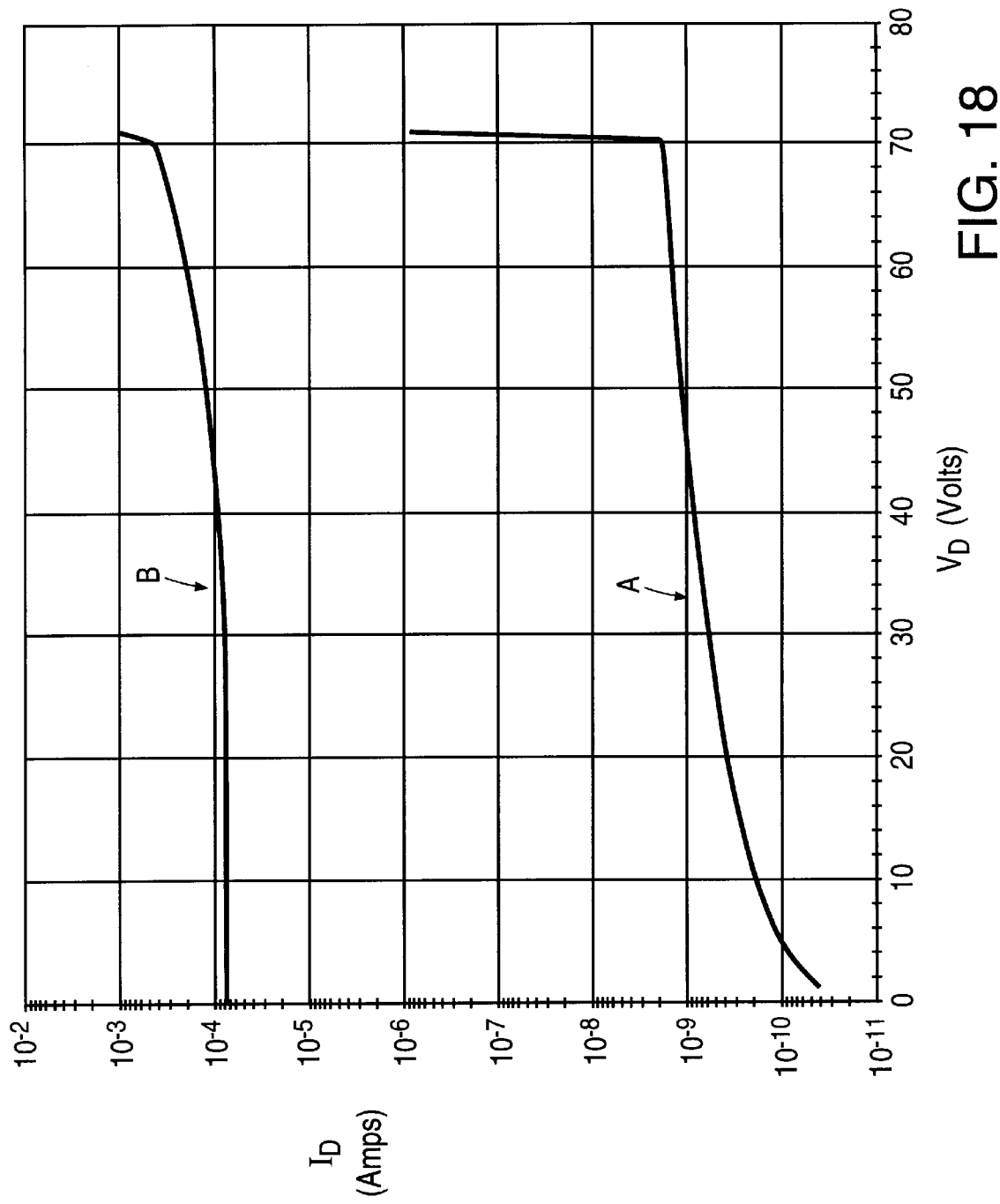
FIG. 18 illustrates a graph which shows the drain current as a function of the drain voltage in two MOSFETs, one of which contains a temperature detection diode and one of which does not contain a temperature correction diode.

The effect of the drain voltage $V_D$ on the drain current $I_D$ is shown in FIG. 18. The curve labeled A shows $I_D$ in a MOSFET without a temperature detection diode, and the curve labeled B shows $I_D$ in a MOSFET with a temperature detection diode. Avalanche breakdown occurs at about 70 V in both cases. The modest increase in $I_D$ for the temperature detection version prior of avalanche is due to impact ionization. This modest increase in $I_D$ does not present a significant problem, particularly in view of the fact that the channel current in a MOSFET when it is turned on is typically many amperes. At $V_D$=30 V, for example, curve B shows a collector current of 85 μA for a 110 μA emitter current, or a base current of 25 μA (the difference between 110 μA and 85 μA). The incremental error current at 40 V is only 15 μA in the base (and also in the collector, since impact ionization occurs in electron-hole pairs).

Figure 19:
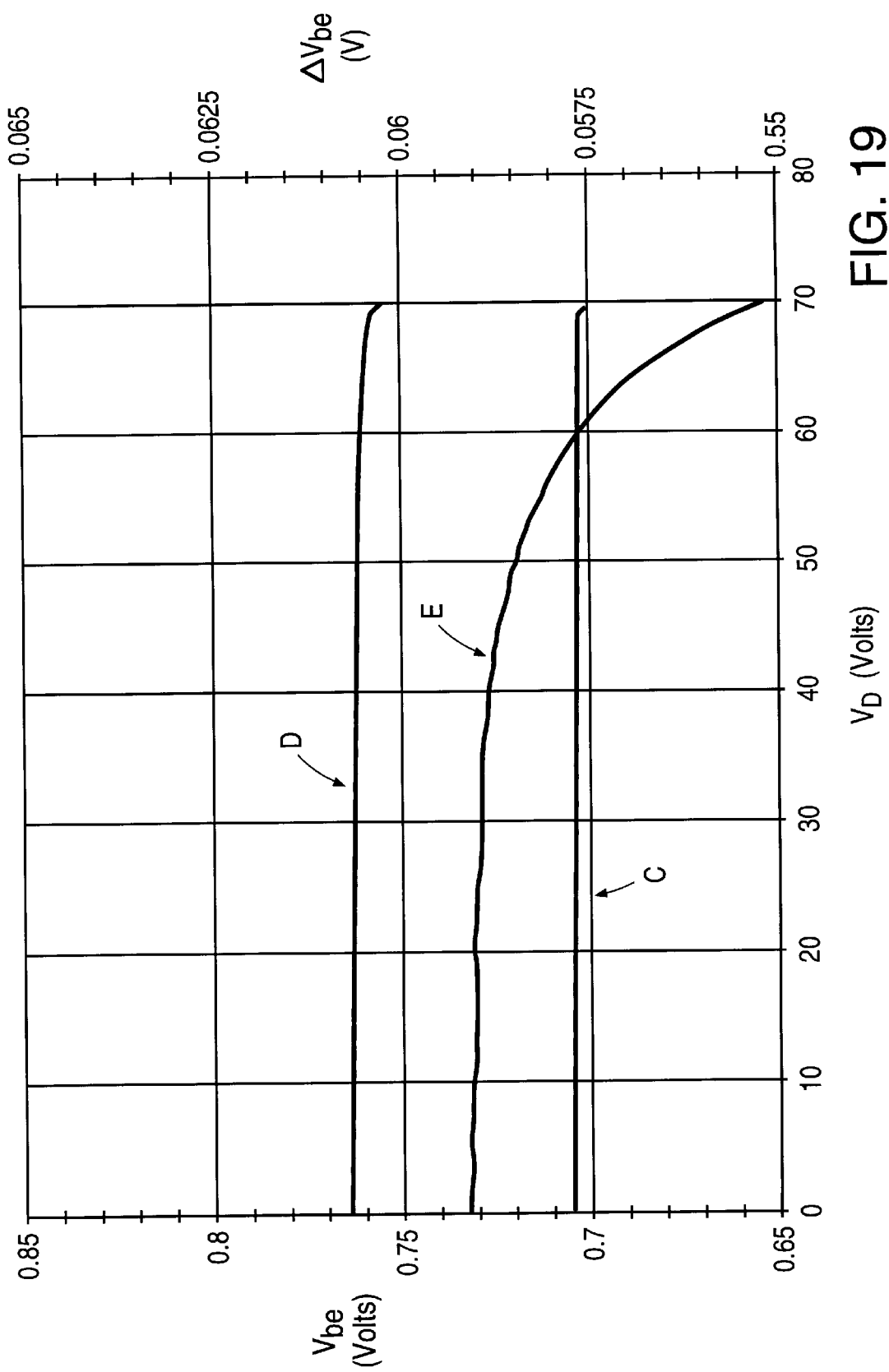
FIG. 19 illustrates a graph which shows $V_{be}$ and $\Delta V_{be}$ as a function of the drain voltage in MOSFETs which contain one or more temperature detection diodes.

In FIG. 19, the curves labeled C and D show $V_{be}$ as a function of $V_D$ for current values of 10 μA and 100 μA, respectively, $V_{be}$ being shown on the lefthand scale. Curve E, referenced to the righthand scale, shows $\Delta V_{be}$ for an embodiment having two temperature detection diodes. $\Delta V_{be}$ changes by about 3 mV over the 70 V range. Referring to FIG. 15, a change of 3 mV in $\Delta V_{be}$ corresponds to a temperature change of about 15° C. A temperature variation of 15° C. could be compensated for by adjusting the temperature at which the MOSFET is turned off. In the range from 0 to 60 V the variation in $\Delta V_{be}$ is only about 1 mV, which is equivalent to about 5° C. The variation in $V_{be}$ evidenced by curves C and D corresponds to an even smaller percentage temperature variation.

FIGS. 18 and 19 indicate that the phenomenon of impact ionization is more of a theoretical than a practical problem and need not stand in the way of the operation of a temperature detection diode in accordance with this invention.

As mentioned above, the temperature in the MOSFET is monitored by supplying the temperature detection diode with a constant current and detecting the voltage drop across the diode. It is desirable to turn the MOSFET off automatically when the temperature reaches a predetermined level. Generally speaking, this can be accomplished by amplifying the voltage drop across the temperature detection diode and comparing the amplified voltage against a reference voltage. When there is a match between the two voltages, a signal is generated to shut down the MOSFET. Where the temperature detection circuitry is implemented is unimportant so long as the reference voltage used for comparison is relatively independent of temperature.

Figure 20:
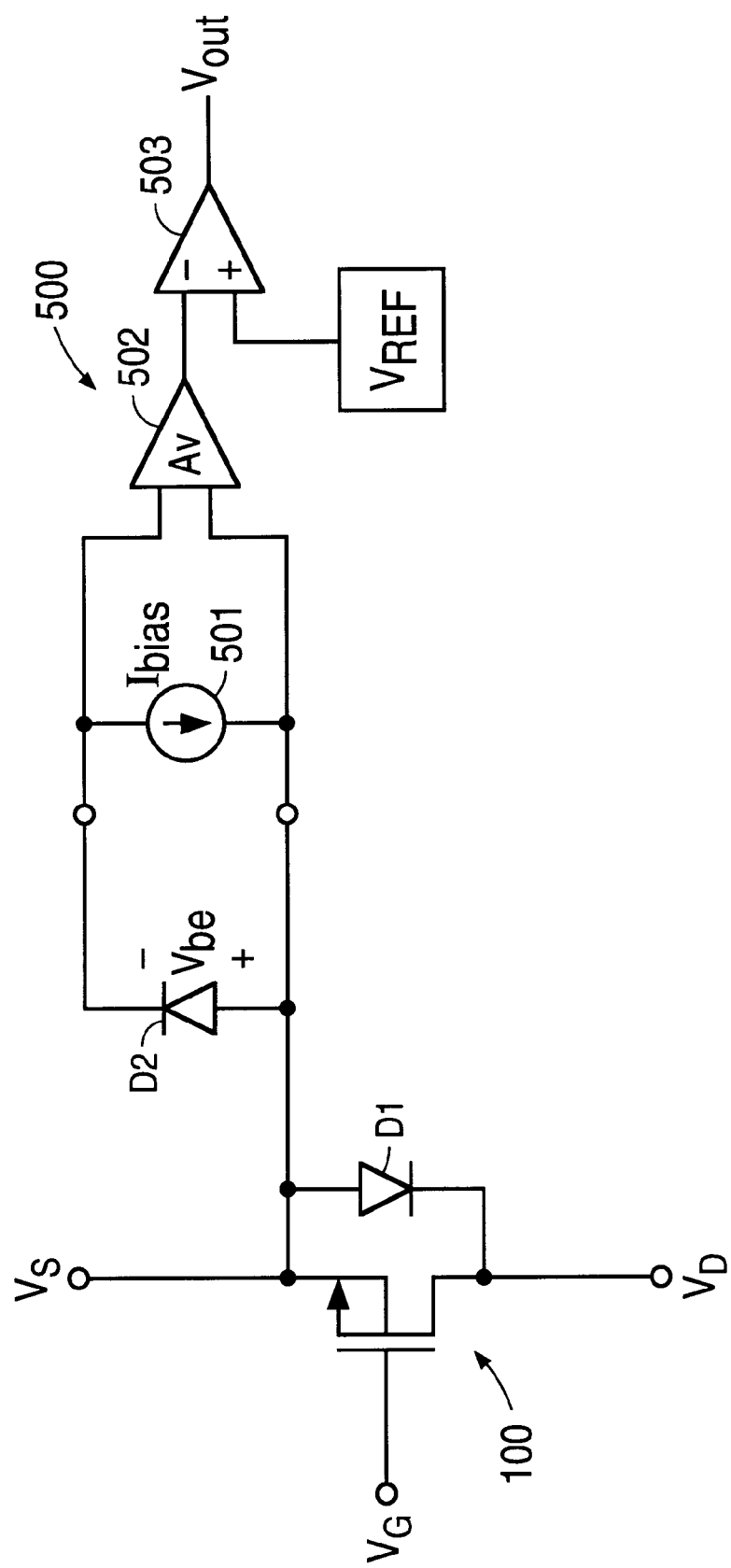
FIG. 20 illustrates a general schematic diagram of an overtemperature detection unit connected to a temperature detection diode within a MOSFET.

FIG. 20 illustrates a general schematic diagram of an overtemperature detection unit 500 connected to MOSFET 100. The temperature detection diode D2 is supplied with a constant current $I_{bias}$ from a current source 501. The voltage $V_{be}$ across diode D2 is amplified in an amplifier 502, and the output of amplifier 502 is delivered to the negative input of a comparator 503, where it is compared against a reference voltage $V_{REF}$. When the output of amplifier 502 is greater than $V_{REF}$, the output of comparator 503 is low; when the output of amplifier 502 falls to $V_{REF}$, the output of comparator 503 goes high and generates a signal $V_{out}$, which causes MOSFET 100 to be shut down.

Figure 21:
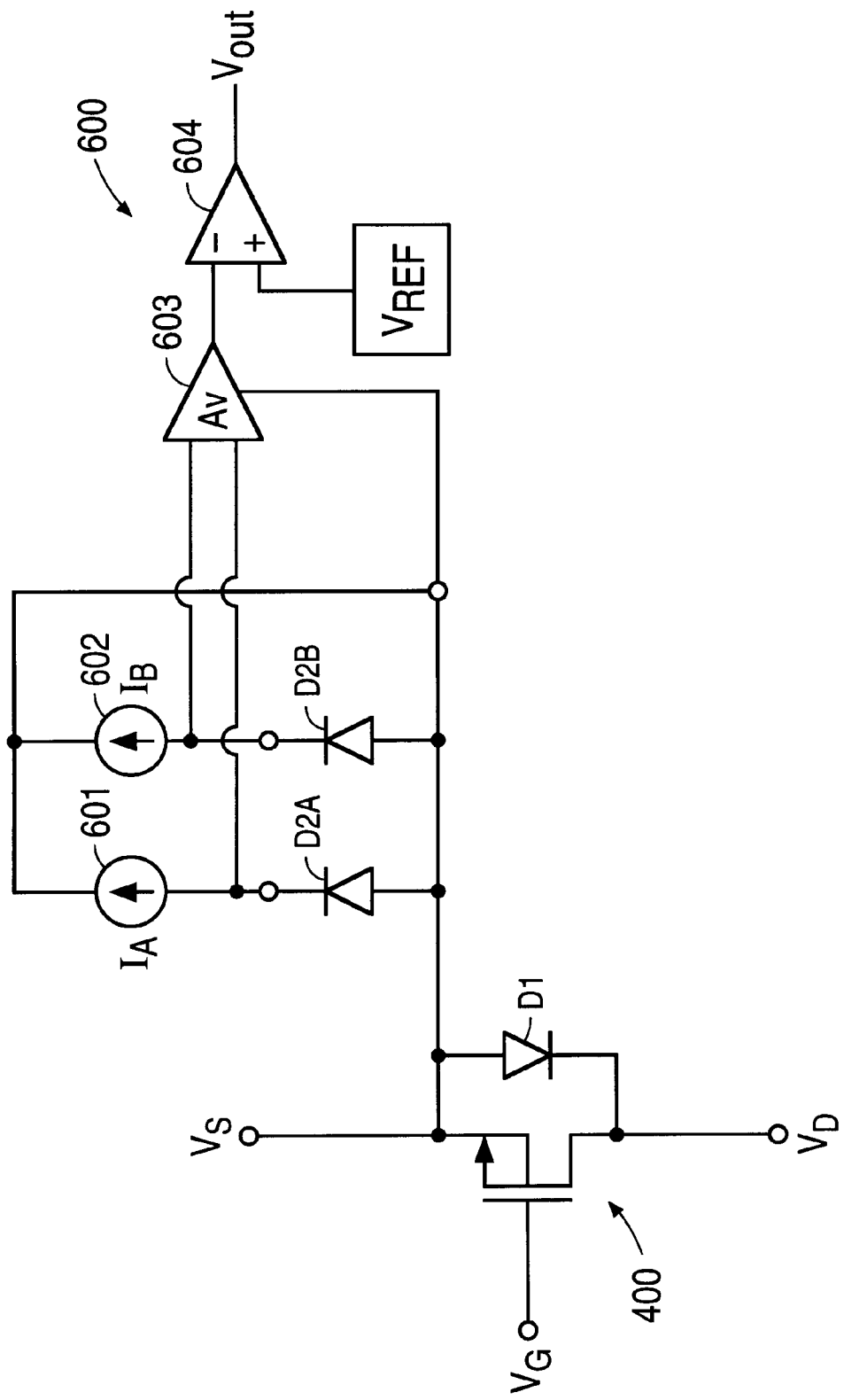
FIG. 21 illustrates a general schematic diagram of an overtemperature detection unit connected to a pair of temperature detection diodes within a MOSFET.

FIG. 21 illustrates a general schematic diagram of a temperature detection unit 600 which is used in junction with MOSFET 400 (shown in FIG. 12). As noted above, MOSFET 400 includes a pair of temperature detection diodes, and the difference between the voltage drops across these diodes is used to determine the temperature of MOSFET 400. Referring to FIG. 21, diode D2A is supplied with a current $I_A$ by a current source 601, and diode D2B is supplied with a current $I_B$ by a current source 602. The respective voltages across D2A and D2B are delivered to the inputs of an amplifier 603, which amplifies the voltage difference. The output of amplifier 603 is sent to the positive input of a comparator 604, the negative input of comparator 604 being biased at $V_{REF}$. When the amplified differential voltage reaches $V_{REF}$, comparator 604 generates a $V_{out}$ signal which shuts down MOSFET 400.

Figure 22:
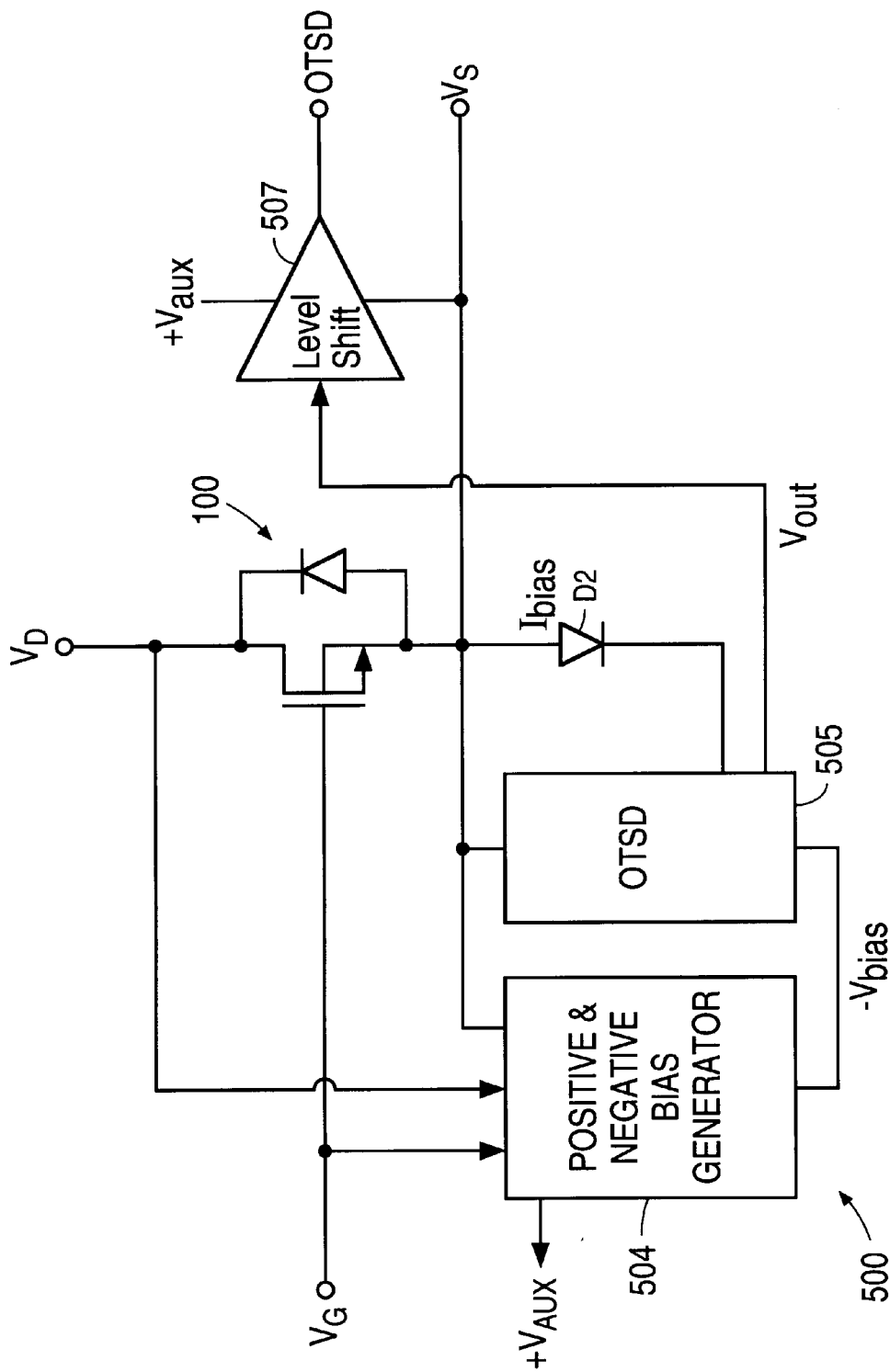
FIG. 22 illustrates a more detailed block diagram of the overtemperature detection unit shown in FIG. 20.

A block diagram of temperature detection unit 500 is illustrated in FIG. 22. Included in temperature detection unit 500 are a positive and negative bias generator 504 and an overtemperature shut down detection (OTSD) circuit 505. Bias generator 504 has inputs connected to the source, drain and gate terminals, respectively, of MOSFET 100, and generates a positive output +$V_{aux}$ and a negative output -$V_{bias}$. OTSD circuit 505 is supplied by $V_S$ and -$V_{bias}$ and includes current source 501 (see FIG. 20), which supplies a constant current $I_{bias}$ to temperature detection diode D2. OTSD circuit 505 delivers the output signal $V_{out}$, which is delivered to a level shifter 507, where $V_{out}$ is shifted to a desired voltage level. The output of level shifter 507 is a signal designated OTSD, which shuts down MOSFET 100 when its internal temperature reaches a predetermined level.

Figure 23:
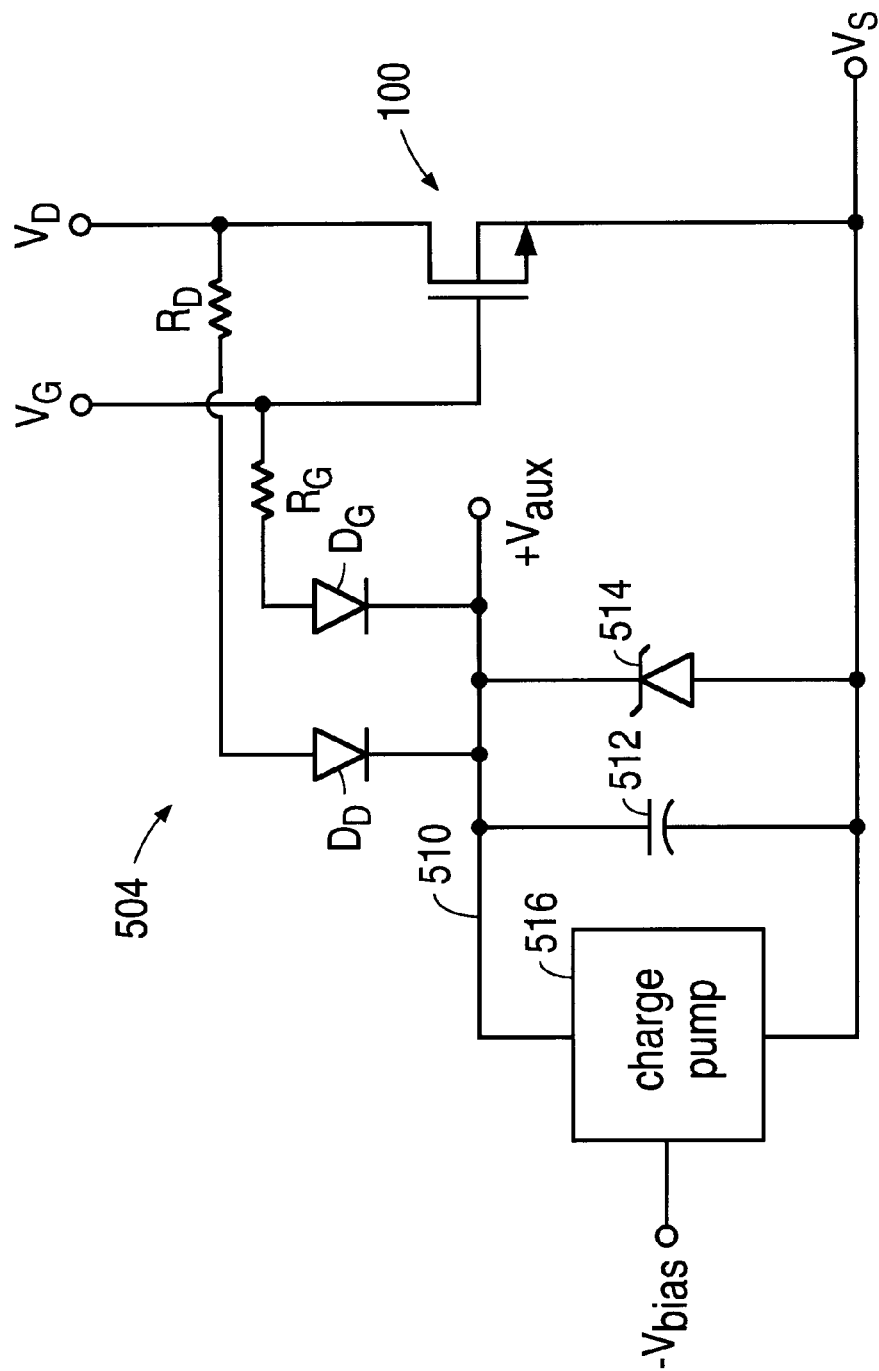
FIG. 23 illustrates a circuit diagram of the positive and negative bias generator within the overtemperature detection unit shown in FIG. 20.
Figure 24A:
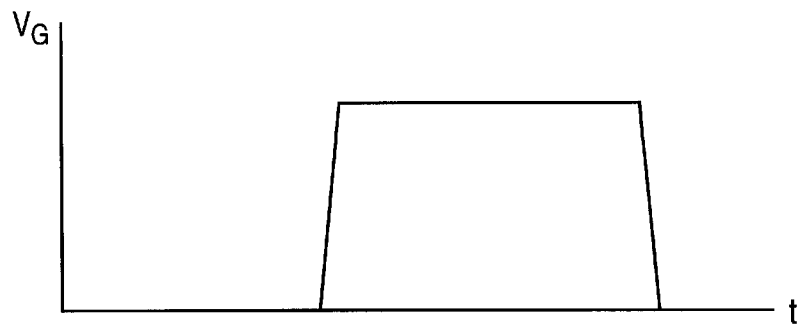
FIGS. 24A–24D illustrate waveforms at various locations in the positive and negative bias generator shown in FIG. 23.
Figure 24B:
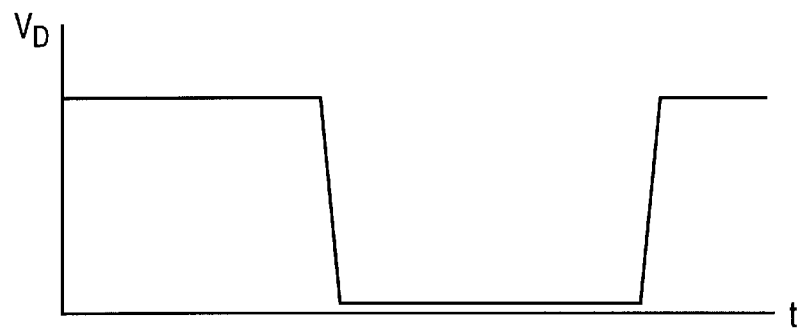

The circuitry within positive and negative bias generator 504 is illustrated in FIG. 23, and FIGS. 24A–24D illustrate several waveforms found in bias generator 504. As illustrated in FIGS. 24A and 24B, since MOSFET 100 is an N-channel device, the voltage at either the gate $V_G$ or at the drain $V_D$ of MOSFET 100 is always high. That is to say, $V_G$ is high when MOSFET 100 is turned on, and $V_D$ is high when MOSFET 100 is turned off (in FIGS. 24A and 24B, the source is assumed to be grounded).

Figure 24C:
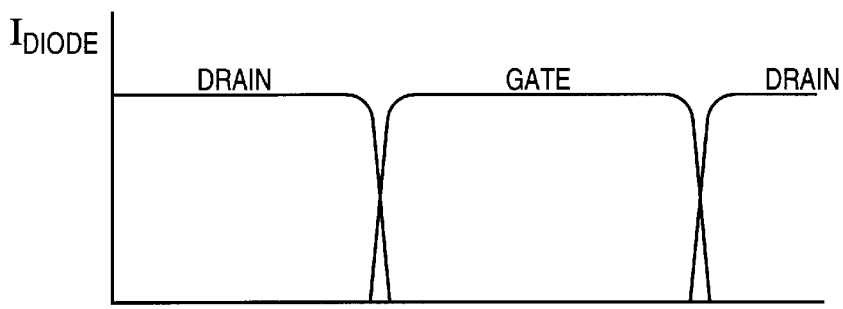
Figure 24D:
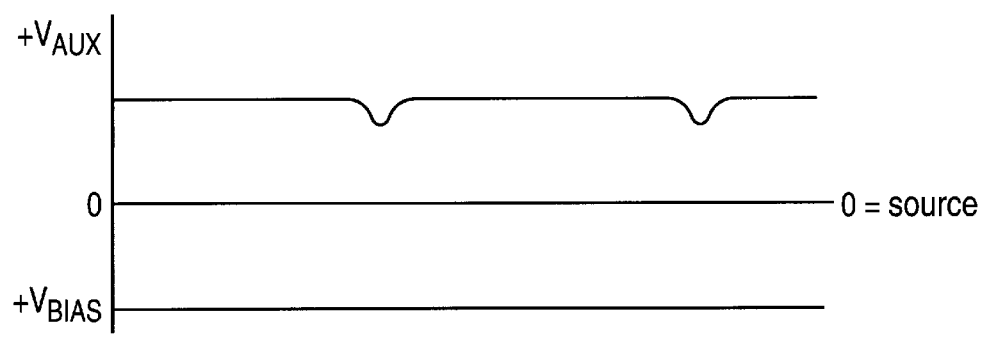

Referring to FIG. 23, the drain of MOSFET 100 is connected through a resistor $R_D$ and a diode $D_D$ to a line 510, and the gate of MOSFET 100 is connected through a resistor $R_G$ and a diode $D_G$ to line 510. As shown in FIG. 24C, as MOSFET 100 is switched on and off, a current $I_{diode}$ is delivered alternately through diodes $D_D$ and $D_G$ into a capacitor 512. The voltage on line 510 is clamped by a zener diode 514 and represents +$V_{aux}$. A charge pump 516 is supplied by +$V_{aux}$ and generates -$V_{bias}$. +$V_{aux}$ and '$V_{bias}$ are shown in FIG. 24D. Powering the MOSFET circuits from the gate and drain signals is described more generally in application Ser. No. 08/459,559, filed concurrently herewith, which is incorporated herein in its entirety.

Figure 25:
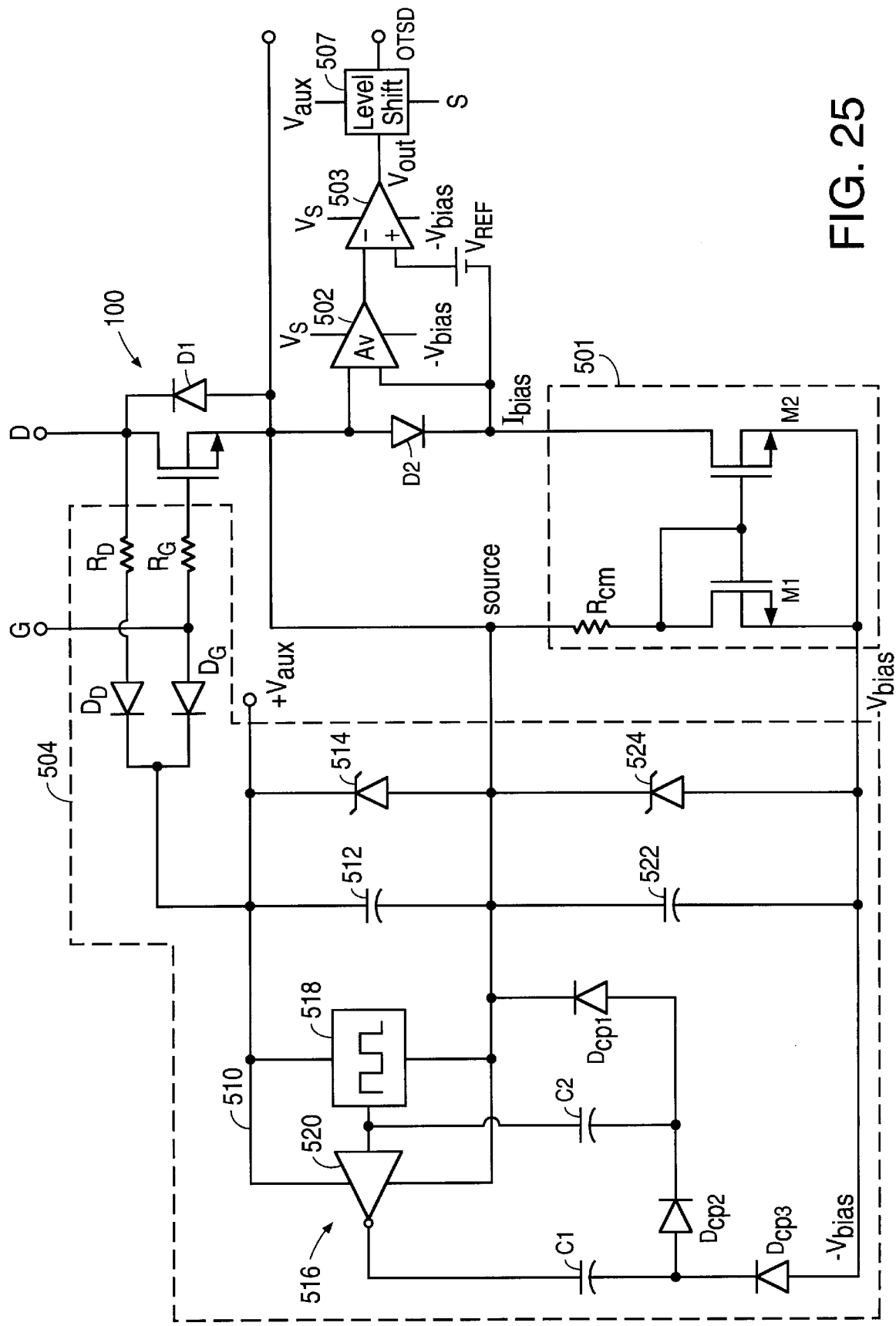
FIG. 25 illustrates a circuit diagram of the charge pump and current source in the overtemperature detection unit shown in FIG. 20.

FIG. 25 shows a more detailed circuit diagram of positive and negative bias generator 504 and OTSC circuit 505. Charge pump 516 includes an oscillator 518, which is supplied by +$V_{aux}$. Oscillator 518 feeds an inverter 520. Charge pump 516 also includes diodes $D_{cp1}$, $D_{cp2}$ and $D_{cp3}$ and capacitors C1 and C2. These elements operate together with oscillator 518 and invertor 520 in a well known manner to produce the negative output -$V_{bias}$ at the anode of diode $D_{cp3}$. This voltage is stored on a capacitor 522 which is clamped by a zener diode 524. Current source 501 is supplied by -$V_{bias}$ and includes a resistor $R_{CM}$ and a mirrored pair of MOSFETs M1 and M2. MOSFETs M1 and M2 operate in a known manner to supply the current $I_{bias}$ to temperature detection diode D2. As described above, the voltage across diode D2 is amplified in amplifier 502, the output of which is delivered to the negative input of comparator 503. Current source 501 amplifier 502 and comparator 503 are included within OTSD circuit 505 (FIG. 22).

Figure 26:
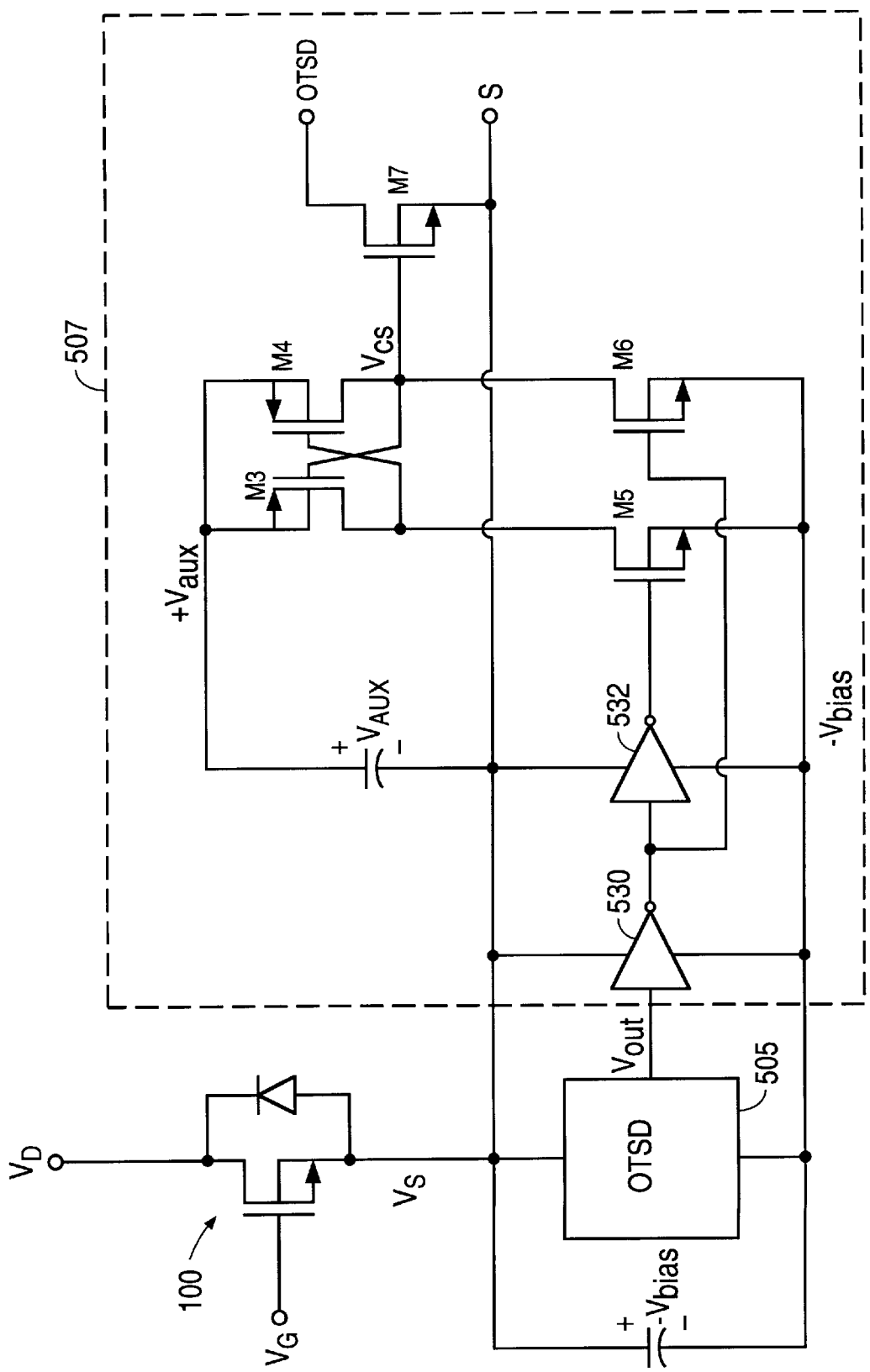
FIG. 26 illustrates a circuit diagram of the level shifter in the overtemperature detection unit shown in FIG. 25.

Since comparator 503 is supplied by $V_S$ and -$V_{bias}$, its output is always at one of these two levels. It is useful to shift this output to a logic supply reference voltage which is better able to communicate with other components. This function is performed in level shifter 507, which is shown in detail in FIG. 26. N-channel MOSFETs M5 and M6 are referenced to $-V_{bias}$ and driven out of phase by signals from inverters 530 and 532. P-channel MOSFETs M3 and M4 are cross-coupled and are tied to $+V_{aux}$, producing an output $V_{LS}$ which swings from $-V_{bias}$ to $+V_{aux}$. When $V_{LS}$ goes high, MOSFET M7 turns on, tying the OTSD signal to $V_S$; otherwise, MOSFET M7 provides an open circuit. The source of MOSFET M7 can be referenced to any convenient potential between $-V_{bias}$ and $+V_{aux}$.

Figure 27:
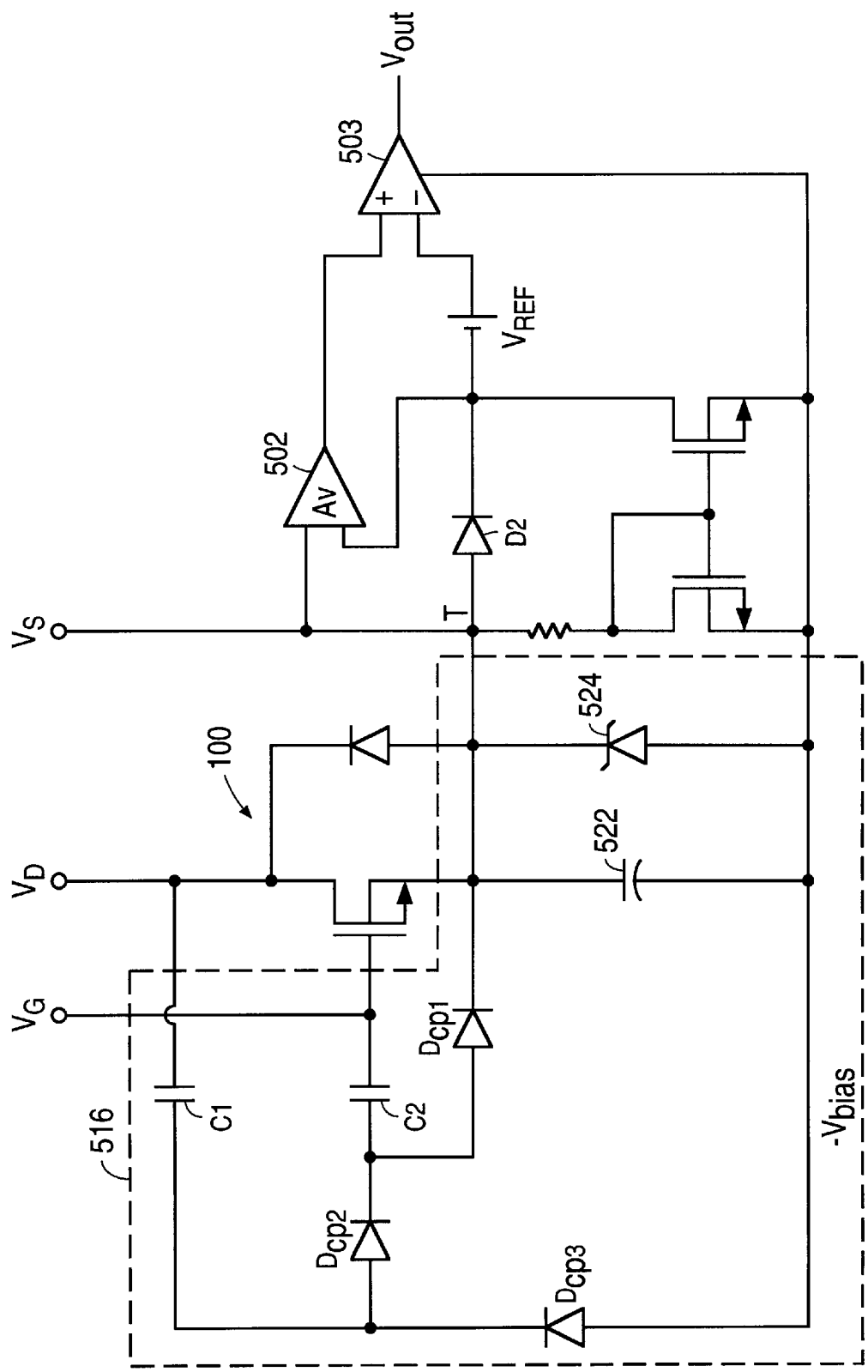
FIG. 27 illustrates a circuit diagram of an alternative embodiment of the charge pump in the overtemperature detection unit shown in FIG. 20.

FIG. 27 illustrates an alternative embodiment of charge pump 516 which is particularly useful when MOSFET 100 is being repeatedly switched off and on. In this embodiment, the oscillator is omitted. The drain of MOSFET 100 is connected through capacitor C1 to the anode of diode $D_{cp2}$, and the gate of MOSFET 100 is connected to capacitor C2 to the cathode of diode $D_{cp2}$. Otherwise, the charge pump operates in the same manner as the embodiment shown in FIG. 25. Since the switching and charge transfer comes from the gate and drain rather than an oscillator, this circuit may be referred to as a two-phase bootstrap circuit.

Figure 28:
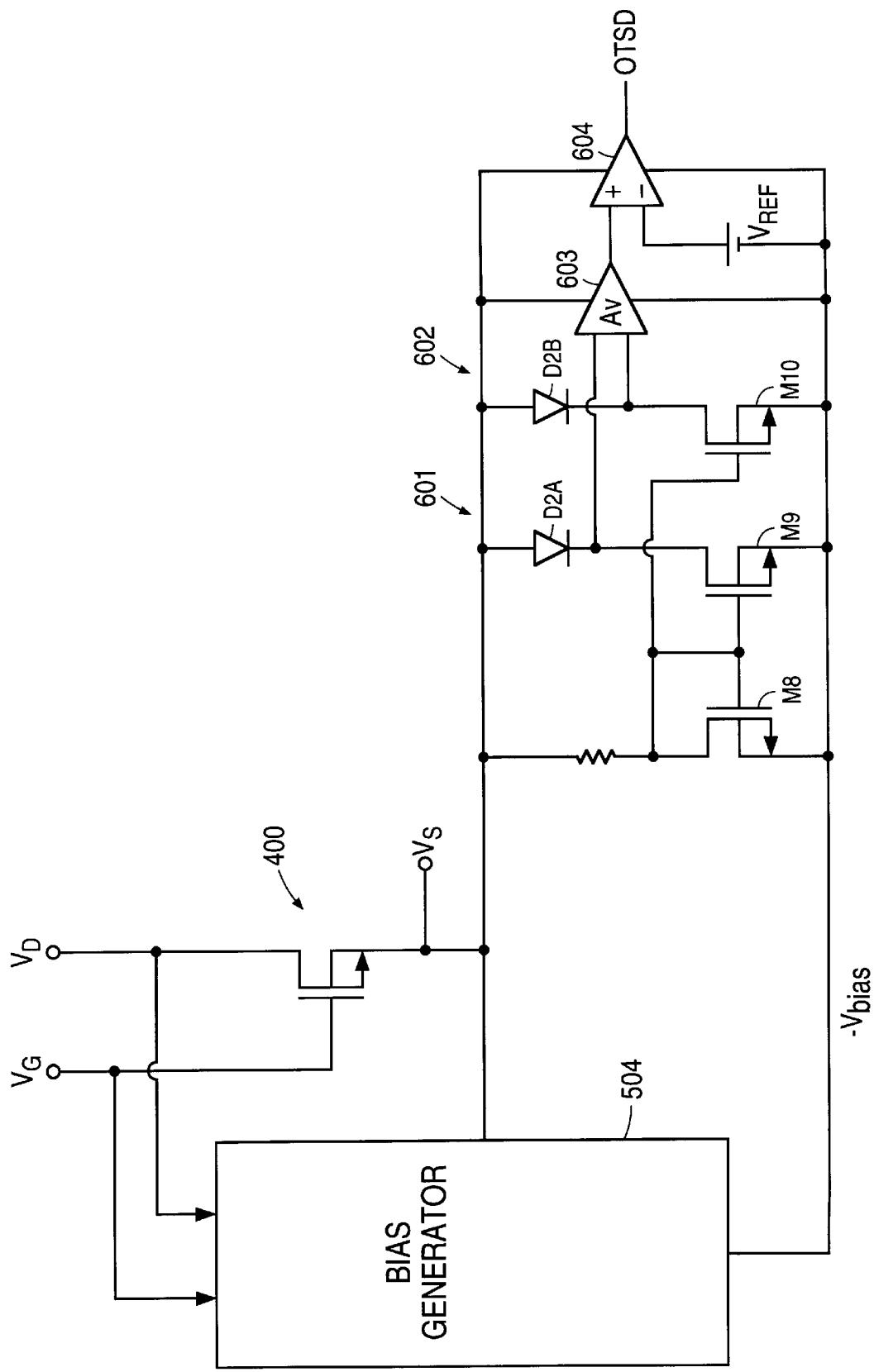
FIG. 28 illustrates a circuit diagram of the current source used to supply the pair of temperature detection diodes in the overtemperature detection unit of FIG. 21.

FIG. 28, which corresponds to FIG. 21, shows the manner in which bias generator 504 is connected to current sources 601 and 602 to provide currents for temperature detection diodes D2A and D2B, respectively. MOSFETs M8, M9 and M10 are connected to $-V_{bias}$, and the current in MOSFET M8 is mirrored in MOSFETs M9 and M10. For example, if MOSFET M10 is ten times as large as MOSFET M9, the current through diode D2B will be ten times as large as the current through diode D2A. The difference between the voltages across diodes D2A and D2B, respectively, is amplified in amplifier 603, the output of which is compared to $V_{REF}$.

While specific embodiments in accordance with this invention had been described, it will be understood by those skilled in the art that numerous alternative embodiments maybe device within the broad scope of this invention. This invention, as defined in the following claims, is intended to include all such alternative embodiments.

We claim:

1. A trenched gate MOSFET comprising:
   a semiconductor body comprising a drain region of a first conductivity type;
   a trench formed in a surface of said semiconductor body;
   a gate formed in said trench, said trench being lined with a dielectric layer for electrically insulating said gate from said semiconductor body;
   a body region of a second conductivity type located adjacent said trench;
   a source region of said first conductivity type located adjacent said trench and abutting said surface of said semiconductor body;
   said MOSFET comprising a temperature detection cell, said temperature detection cell comprising a first diffusion of said first conductivity type and a second diffusion of said second conductivity type, said second diffusion enclosing and forming a PN junction with said first diffusion, said second diffusion extending to a level below a level of a bottom of said trench and having a dopant concentration such that said second diffusion functions to protect said dielectric layer at a corner of said trench from damage from high electric fields and to inhibit a turn-on of a bipolar transistor comprising said first and second diffusions, said PN junction forming a temperature detection diode.

2. The trenched gate MOSFET of claim 1 further comprising a first metal contact which contacts said source region and said second diffusion.

3. The trenched gate MOSFET of claim 2 further comprising a second metal contact which contacts said first diffusion.

4. The trenched gate MOSFET of claim 1 wherein said semiconductor body comprises a substrate and an epitaxial layer grown on a surface of said substrate.

5. The trenched gate MOSFET of claim 1 further comprising a deep diffusion of said second conductivity type contiguous to said body region, said deep diffusion extending downward to a level below a bottom of said trench.

6. The trenched gate MOSFET of claim 1 further comprising a buried region of said second conductivity type, said buried region being located beneath and spaced apart from said first diffusion, said buried region having a higher dopant concentration than said second diffusion.

7. The trenched gate MOSFET of claim 6 wherein said buried region is located at least 0.5 $\mu$m below a surface of said substrate.

8. The trenched gate MOSFET of claim 4 wherein said trench is formed entirely within said epitaxial layer.

9. The trenched gate MOSFET of claim 1 further comprising a first metal contact which contacts said source region and a second metal contact which contacts said second diffusion, said first and second metal contacts being electrically isolated from each other.

10. The trenched gate MOSFET of claim 9 further comprising a third metal contact which contacts said first diffusion.

11. A trenched gate MOSFET comprising:
   a semiconductor body comprising a drain region of a first conductivity type;
   a trench formed in a surface of said semiconductor body;
   a gate formed in said trench, said gate being electrically insulated from said semiconductor body by a dielectric layer;
   a body region of a second conductivity type located adjacent said trench;
   a source region of said first conductivity type located adjacent said trench and abutting said surface of said semiconductor body;
   said MOSFET comprising a temperature detection cell, said temperature detection cell comprising first and second diffusions of said first conductivity type and a third diffusion of said second conductivity type, said first and second diffusions being spaced apart from each other and being enclosed in said third diffusion, a first diode being formed at a PN junction between said first and third diffusions and a second diode being formed at a PN junction between said second and third diffusions, said first and second diodes being for detecting a temperature within said MOSFET; and
   a first metal contact in electrical contact with said first diffusion and a second metal contact in electrical contact with said second diffusion, said first and second metal contacts being electrically isolated from each other.

12. The trenched gate MOSFET of claim 11 further comprising a first metal contact which contacts said source region and said third diffusion.

13. The trenched gate MOSFET of claim 11 wherein said semiconductor body comprises a substrate and an epitaxial layer grown on a surface of said substrate.

14. The trenched gate MOSFET of claim 11 further comprising a deep diffusion of said second conductivity type contiguous to said body region, said deep diffusion extending downward to a level below a bottom of said trench.

15. A combination comprising the trenched gate MOSFET of claim 1 and an overtemperature detection unit, said overtemperature detection unit comprising:

a current source for supplying a current to said temperature detection diode;

an amplifier for amplifying a voltage across said temperature detection diode; and a comparator for comparing an output of said amplifier with a reference voltage.

16. The combination of claim 15 further comprising a bias generator, first and second inputs of said bias generator being connected to said drain and source regions, respectively, of said MOSFET, a first output of said bias generator being connected to said current source.

17. The combination of claim 16 wherein said first output of said bias generator is connected to said amplifier.

18. The combination of claim 16 wherein said first output of said bias generator is connected to said comparator.

19. The combination of claim 16 further comprising a level shifter, a signal input of said level shifter being connected to an output of said comparator, a second output of said bias generator being connected to a power supply input of said level shifter.

20. The combination of claim 19 wherein said level shifter comprises a first NMOSFET and a first PMOSFET connected in a first conduction path and a second NMOSFET and a second PMOSFET connected in a second conduction path, said first and second conduction paths being connected in parallel, the gates of said first and second NMOSFETs being driven out of phase, a node between said second NMOSFET and said second PMOSFET being connected to a gate of a third PMOSFET, an output of said level shifter being connected to a terminal of said third PMOSFET.

21. The combination of claim 16 wherein said bias generator comprises:

a charge storage capacitor;

a second diode connected between said drain and said charge storage capacitor and a third diode connected between said gate and said charge storage capacitor; and a charge pump supplied by a voltage across said capacitor.

22. The combination of claim 21 wherein said first output of said bias generator comprises an output of said charge pump.

23. The combination of claim 21 wherein said second output of said bias generator comprises a terminal of said capacitor.

24. The combination of claim 21 wherein said current source comprises a pair of current mirror transistors.

25. The combination of claim 21 wherein said charge pump comprises:

a first charge pump capacitor connected between said drain region and a first node;

a second charge pump capacitor connected between said gate and a second node;

a first charge pump diode connected between said first node and said second node;

a second charge pump diode connected between said second node and a first electrode of said charge storage capacitor; and a third charge pump diode connected between a second electrode of said charge storage capacitor and said first node.

26. The trenched-gate MOSFET of claim 11 further comprising:

a first current source connected to said first metal contact;

a second current source connect to said second metal contact; and a comparator coupled to said first and second diodes.

27. The trenched-gate MOSFET of claim 26 wherein said comparator is responsive to a difference between (a) a difference between a first voltage across said first diode and a second voltage across said second diode, and (b) a reference voltage.

28. A method of detecting a temperature within a MOSFET formed in a semiconductor chip, said method comprising:

fabricating first and second temperature detection diodes integrally within said semiconductor chip;

causing respective currents to flow through said diodes;

detecting a first voltage across said first temperature detection diode and detecting a second voltage across said second temperature detection diode;

comparing said first and second voltages;

using the difference between said first and second voltages to determine said temperature.

29. The method of claim 28 wherein a current density in said first temperature detection diode is not equal to a current density in said second temperature detection diode.

30. The method of claim 29 wherein said diodes are the same size and said respective currents are of unequal magnitude.

31. The method of claim 29 wherein said respective currents are of equal magnitude and said diodes are of unequal size.

* * * * *